United States Patent
Kim et al.

(10) Patent No.: US 8,063,550 B2
(45) Date of Patent: Nov. 22, 2011

(54) FLAT PANEL DISPLAY WITH TAPER REDUCING LAYER

(75) Inventors: Mu-Hyun Kim, Suwon-si (KR);
Byung-Doo Chin, Seongnam-si (KR);
Myung-Won Song, Suwon-si (KR);
Seong-Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 926 days.

(21) Appl. No.: 10/947,421

(22) Filed: Sep. 23, 2004

(65) Prior Publication Data

US 2005/0116240 A1    Jun. 2, 2005

(30) Foreign Application Priority Data

Nov. 26, 2003    (KR) .................. 10-2003-0084746

(51) Int. Cl.
*H01J 1/62* (2006.01)
*H01J 63/04* (2006.01)

(52) U.S. Cl. ........................ 313/503; 313/506
(58) Field of Classification Search .............. None
See application file for complete search history.

(56) References Cited

U.S. PATENT DOCUMENTS

| | | | |
|---|---|---|---|
| 5,684,365 A | 11/1997 | Tang et al. | |
| 6,246,179 B1 | 6/2001 | Yamada | |
| 6,252,297 B1 * | 6/2001 | Kemmochi et al. | 257/640 |
| 6,274,887 B1 * | 8/2001 | Yamazaki et al. | 257/72 |
| 6,573,651 B2 * | 6/2003 | Adachi et al. | 313/504 |
| 2002/0113248 A1 | 8/2002 | Yamagata et al. | |
| 2002/0140643 A1 * | 10/2002 | Sato | 345/76 |
| 2003/0146695 A1 | 8/2003 | Seki | |
| 2003/0170491 A1 * | 9/2003 | Liao et al. | 428/690 |

(Continued)

FOREIGN PATENT DOCUMENTS

CN    1372325    10/2002

(Continued)

OTHER PUBLICATIONS

Yoshihara Sato, "Molecular Electronics and Bioelectronics", Japan Society of Applied Physics, 2000, vol. 11, No. 1, pp. 86-99.

(Continued)

*Primary Examiner* — Toan Ton
*Assistant Examiner* — Britt D Hanley
(74) *Attorney, Agent, or Firm* — H.C. Park & Associates, PLC

(57) ABSTRACT

The present invention discloses an organic light emitting device for preventing element defects and improving picture quality by reducing a taper angle of a substrate surface. The flat panel display of the present invention comprises, an insulating substrate, a lower layer formed on the insulating substrate and having a first step and a first taper angle with respect to the substrate surface, and an upper layer formed on the insulating substrate and for reducing the taper angle of the lower layer. The upper layer has a second taper angle smaller than the first taper angle of the lower layer. The upper layer is a conductive layer that may be applied by a wet coating method, has a charge transporting capability, and is selected from at least one of a small-molecule organic layer including a carbazole-based, arylamine-based, hydrazone-based, stilbene-based, oxadiazole-based, starburst-based derivatives, and a polymer organic layer including PEDOT, PANI, carbazole-based, arylamine-based, perylene-based, pyrrole-based, oxadiazole-based derivatives.

6 Claims, 19 Drawing Sheets

U.S. PATENT DOCUMENTS

2003/0227253 A1 * 12/2003 Seo et al. .................. 313/504

FOREIGN PATENT DOCUMENTS

| | | |
|---|---|---|
| CN | 1423513 | 6/2003 |
| EP | 1058311 | 12/2000 |
| EP | 1063704 | 12/2000 |
| EP | 1315209 | 5/2003 |
| EP | 1331667 | 7/2003 |
| JP | 08-227276 | 9/1996 |
| JP | 2001-189192 | 7/2001 |
| JP | 2001-195016 | 7/2001 |
| JP | 2001-312223 | 11/2001 |
| JP | 2002-164181 | 6/2002 |
| JP | 2002-175029 | 6/2002 |
| JP | 2002-208491 | 7/2002 |
| JP | 2003-022892 | 1/2003 |
| JP | 2003-091246 | 3/2003 |
| JP | 2003-131593 | 5/2003 |
| JP | 2003-243171 | 8/2003 |
| JP | 2003-313655 | 11/2003 |
| JP | 2004-031262 | 1/2004 |
| JP | 2004-234901 | 8/2004 |
| KR | 10-1995-0010703 | 4/1995 |
| KR | 10-2001-0003764 | 1/2001 |
| KR | 10-2004-0062023 | 7/2004 |

OTHER PUBLICATIONS

A. Elschner, F. Jonas et al, "High-Resistivity PEDT/PSS for Reduced Crosstalk in Passive Matrix OELs", Asia Display/IDW' 01, 2001, pp. 1427-1430.

* cited by examiner

71

72

72

FLAT PANEL DISPLAY WITH TAPER REDUCING LAYER

CROSS-REFERENCE TO RELATED APPLICATION

This application claims the benefit of Korea Patent Application No. 2003-84746, filed on Nov. 26, 2003, the disclosure of which is incorporated herein by reference in its entirety.

BACKGROUND OF THE INVENTION

1. Field of the Invention

The present invention relates to a flat panel display and, more particularly, to an active matrix organic light emitting device capable of avoiding a defective element and improving picture quality by reducing a taper angle of a substrate surface.

2. Background of the Invention

In general, pixels in an active matrix organic light emitting device (AMOLED) are arranged on the substrate in a matrix form. Each pixel includes an electroluminescence (EL) element, where an anode electrode, an organic thin film layer, and a cathode electrode are stacked, and a thin film transistor (TFT) as an active element connected to the EL element for driving the EL element.

FIG. 1A shows a cross-sectional view of a conventional bottom-emitting OLED. Referring to FIG. 1A, a buffer layer 105 is formed on an insulating substrate 100, and source and drain regions 111 and 115 of a semiconductor layer 110 are formed on the buffer layer 105. A gate 125 is formed on a gate insulating layer 120, and source and drain electrodes 141 and 145 are formed on an inter-layer insulating layer 130 through contact holes 131 and 135 to be connected to the source and drain regions 111 and 115, respectively. As a result, the TFT is fabricated. Wiring 147, such as a data line or a power supply line, is formed on the inter-layer insulating layer 130.

An anode electrode 170, as a lower electrode connected to the drain electrode 145 through a via hole 155, is formed on a passivation layer 150, and an organic thin film layer 185 and a cathode electrode 190, as an upper electrode, are formed on the insulating substrate 100, thereby fabricating the organic EL element.

FIG. 1B shows a detailed cross-sectional view of the red on R pixel EL element within an emission region of an R pixel in the OLED of FIG. 1A. A method for fabricating the EL diode is described in detail below, with reference to FIG. 1B. A cleaning process is performed after forming the anode electrode 170 connected to the drain electrode 145 of the TFT through the via hole 155. A 600 Å thick hole injecting layer 185a is then formed with CuPc on the substrate using a vacuum deposition method, and a 300 Å thick hole transporting layer 185b is formed with NPB on the hole injecting layer 185a. A 200 Å thick Alq+DCM is deposited on the hole transporting layer 185b to form a red color emission layer 185c. A 200 Å thick Alq3 is formed on the red color emission layer 185c to form an electron transporting layer 185d, thereby forming the organic thin film layer 185. Finally, a LiF/Al, as the cathode electrode 190, is deposited by a thermal evaporation method. Although not shown in the figure, a hole blocking layer may be formed between the red color emission layer 185c and the electron transporting layer 185d, or an electron injecting layer may be formed on the electron transporting layer 185d.

After forming the organic thin film layer 185 and the cathode electrode 190 on the anode electrode 170, as shown in FIG. 1B, a sealant (not shown) is applied on the insulating substrate 100, and an encapsulating substrate is bonded to the insulating substrate 100 to prevent external oxygen and moisture from being introduced inside, thereby fabricating the conventional OLED.

The conventional OLED having the above mentioned structure may have pinhole defects occurring near a stepped portion of the anode electrode 170, near the via hole 155 and near the contact holes 131 and 135, and/or short-circuit defects between the anode electrode 170 and the cathode electrode 190. Furthermore, portions where the organic emission layer 185c is not deposited or not uniformly deposited may be thinner than other portions near the stepped portion of the anode electrode 170 and near the contact holes 131 and 135 and via holes 155. When a high voltage is applied between the anode electrode 170 and the cathode electrode 190, a current density may focus on the portion where the organic emission layer 185c is not deposited or is thinly deposited, so that one or more spherical dark spot may occur. As a result, the emission region may decrease and the picture quality may deteriorate due to the occurrence of the dark spot.

Oxygen and/or moisture may be more easily introduced through a portion where the cathode electrode 190 is not densely formed. When a high voltage is applied between the anode electrode 170 and the cathode electrode 190, a current density is focused on the portion where the cathode electrode 190 is not densely formed, and a void occurs in the cathode electrode 190 due to an electromigration. Heat may occur due to increased resistance from an external oxygen inflow. As a result, a spherical dark spot may occur in the portion as time passes.

To prevent defects, such as a short-circuit or the dark spot, a contact hole or via hole may be formed having a small taper angle. However, there has been a limit in reducing the taper angle of the contact hole or via hole due to difficulties in design of a high resolution flat panel display.

U.S. Pat. No. 5,684,365 discloses a technique that limits a taper angle of a passivation layer at an edge of an opening for exposing some portions of the anode electrode. FIG. 2 illustrates a cross-sectional view of a conventional bottom-emitting OLED. Referring to FIG. 2, a buffer layer 205 is formed on an insulating substrate 200, and a semiconductor layer 210 having source and drain regions 211 and 215 is formed on the buffer layer 205. A gate 225 is formed on a gate insulating layer 220, and source and drain electrodes 241 and 245 are formed to be connected to the source and drain regions 211 and 215, respectively, through contact holes 231 and 235 on an inter-layer insulating layer 230. In this case, an anode electrode 270, as a lower electrode to be connected to the drain electrode 245, is formed on the inter-layer insulating layer 230.

After depositing a passivation layer 250, at a thickness of 0.5 to 1.0 μm formed of an insulating layer, such as an silicon nitride layer, on a substrate 200, the passivation layer 250 is etched to form an opening 275 exposing some portions of the anode electrode 270. In this case, the passivation layer 250 is formed to have a taper angle of 10 to 30° with respect to the anode electrode 270 at an edge of the opening 275. An organic thin film layer 285 and a cathode electrode 290 as an upper electrode are then formed on the substrate 200. The organic thin film layer 285 has at least one of a hole injecting layer, a hole transporting layer, an R, G, or B emission layer, a hole barrier layer, an electron transporting layer, or an electron injecting layer, as shown in FIG. 1B.

U.S. Pat. No. 6,246,179 discloses a technique that uses an organic insulating layer having a planarizing function to prevent defects from occurring near a via hole or a contact hole and at a stepped portion. FIG. 3 shows a cross-sectional view of the OLED having a conventional top-emitting structure. Referring to FIG. 3, a buffer layer 305 is formed on an insulating substrate 300, and a semiconductor 310, having source and drain regions 311 and 315, is then formed on the buffer layer 305. A gate 325 is formed on a gate insulating layer 320, and source and drain electrodes 341 and 345 are connected to the source and drain regions 311 and 315, respectively, through contact holes 331 and 335 on an inter-layer insulating layer 330. In this case, wiring 347, such as a data line or a power supply line, is formed at the same time the source and drain electrodes 341 and 345 are formed on the inter-layer insulating layer 330.

A planarization layer 360 is formed on a passivation layer 350, and an anode electrode 370, as a lower electrode, is connected to one electrode, for example, to the drain electrode 345 between the source and drain regions 341 and 345 through the via hole 355 on the planarization layer 360. A pixel defining layer 365, having an opening 375 for exposing some portions of an anode electrode 370, is formed, and an organic thin film layer 385 and a cathode electrode 390 as an upper electrode are formed on the pixel defining layer 365 and the anode 370. The organic thin film layer 385 has at least one of a hole injecting layer, a hole transporting layer, a R, G, or B emission layer, a hole blocking layer, an electron transporting layer and an electron injecting layer, as shown in FIG. 1B.

As in the above mentioned conventional OLED, a taper angle of the passivation layer connected to the anode electrode within the opening is limited to between 10° to 30°, or a taper angle of the pixel defining layer is limited to between 20° to 80°, thereby preventing defects in the organic emission layer. In addition, the problem of the stepped portion may be solved by using the planarization layer, thereby preventing the defect of the organic emission layer.

However, in the high-resolution OLED, there has been a limit to reducing the taper angle of the passivation layer or the pixel defining layer due to difficulties in the design process. Furthermore, the reliability of the element depends on a taper angle between the pixel defining layer and the anode electrode. When the taper angle is large, the organic emission layer and the cathode electrode easily deteriorate at the edge of the opening. When the taper angle is small, there has been a limit to reducing the tape angle and thickness of the pixel defining layer due to problems of parasitic capacitance and a stepped portion caused by the wiring.

In addition, since the cathode electrode deposited on the entire surface of the substrate is not densely formed near the contact hole, near the via hole and at the stepped portion, as described above, dark spot may occur, or a pinhole or short-circuit defect may occur near the contact hole, near the via hole and at the stepped portion.

SUMMARY OF THE INVENTION

The present invention provides an OLED capable of preventing pinhole and short-circuit defects in a contact hole and a via hole.

The present invention provides an OLED capable of improving a picture quality by reducing or preventing a pattern defect of an organic EL layer.

The present invention provides an OLED capable of reducing or preventing inflow of oxygen or moisture by densely forming a cathode electrode.

The present invention provides an OLED capable of reducing or preventing a dark spot from being occurred in an emission region of a pixel.

An exemplary embodiment of the present invention provides a flat panel display having an insulating substrate, a lower layer formed on the insulating substrate and having a first step and a first taper angle with respect to a surface of the substrate, and an upper layer formed on the insulating substrate and for reducing the taper angle of the lower layer, wherein the upper layer has a second taper angle smaller than the first taper angle of the lower layer.

According to another exemplary embodiment of the present invention, a flat panel display includes an insulating substrate including a thin film transistor having at least source and drain electrodes, an insulating layer formed on the insulating substrate and having a via hole for exposing one of the source and drain electrodes, an organic EL element having a lower electrode, an organic film layer and an upper electrode formed on the insulating layer and connected to the exposed one through the via hole, and a taper reducing layer formed on the lower electrode, wherein a taper angle of the taper reducing layer in the via hole has a first taper angle smaller than that of the via hole, and a taper angle of the taper reducing layer at an edge of the lower electrode has a second taper angle smaller than that of the edge of the lower electrode.

According to a further embodiment of the present invention, a flat panel display includes an insulating substrate including a thin film transistor having at least source and drain electrodes, a first insulating layer formed on the insulating substrate and having a via hole for exposing one of the source and drain electrodes, a lower electrode formed on the first insulating layer and connected to the exposed one through the via hole, a second insulating layer having an opening for exposing a portion of the lower electrode, an organic film layer formed on the second insulating layer and the opening, an upper electrode formed on the organic film layer, and a taper reducing layer formed on the lower electrode, wherein the taper reducing layer has a taper angle smaller than that of the second insulating layer in the opening.

In an additional exemplary embodiment of, the present invention, a flat panel display includes an insulating substrate including a thin film transistor which includes a semiconductor layer having source and drain regions, a first insulating layer having contact holes for exposing some portions of the source and drain regions, and source and drain electrodes connected to the source and drain regions through the contact holes, a second insulating layer formed on the insulating substrate and having a via hole for exposing one of the source and drain electrodes, an EL element formed on the second insulating layer to be connected to one electrode of the thin film transistor through the via hole and having a lower electrode, an organic film layer and an upper electrode, and a taper reducing layer formed on the lower electrode, wherein a taper angle of the taper reducing layer in the contact hole has a first taper angle smaller than that of the contact hole, a taper angle of the taper reducing layer in the via hole has a second taper angle smaller than that of the via hole, and a taper angle of the taper reducing layer at an edge of the lower electrode has a third taper angle smaller than that of the edge of the lower electrode.

According to a further exemplary embodiment of the present invention, a flat panel display includes an insulating substrate including a thin film transistor which includes a semiconductor layer having source and drain regions, a first insulating layer having contact holes for exposing portions of the source and drain regions and source and drain electrodes connected to the source and drain regions through the contact holes, and a second insulating layer formed on the insulating substrate and having a via hole for exposing one of the source and drain electrodes. The flat panel display further includes a lower electrode formed on the second insulating layer and connected to the exposed one of the source and drain electrodes, a third insulating layer having an opening for exposing a portion of the lower electrode, an organic film layer formed on the third insulating layer and the opening, an upper electrode formed on the organic film layer, and a taper reducing layer formed on the lower electrode, wherein a taper angle of the taper reducing layer in the opening is smaller than that of the opening.

An additional exemplary embodiment of the present invention provides a flat panel display includes an insulating substrate including a thin film transistor which includes a semiconductor layer having source and drain regions, a first insulating layer having contact holes for exposing some portions of the source and drain regions and source and drain electrodes connected to the source and drain regions through the contact holes, a lower electrode formed on the same first insulating layer as the source and drain electrodes and connected to one of the source and drain electrodes, and a second insulating layer having an opening for exposing a portion of the lower electrode. The flat panel display also includes an organic film layer formed on the second insulating layer and the opening, an upper electrode formed on the organic film layer, and a taper reducing layer formed on the lower electrode, wherein a taper angle of the taper reducing layer in the contact hole have a first taper angle smaller than that of the contact hole, and a taper angle of the taper reducing layer in the opening has a second taper angle smaller than that of the opening.

Still a further exemplary embodiment of the present invention provides a flat panel display including an insulating substrate, a lower layer formed on the insulating layer and having a first step and a first taper angle $\theta 1$ with respect to a surface of the substrate, and an upper layer formed on the insulating substrate and having a second taper angle $\theta 2$ with respect to the substrate surface for reducing the first taper angle of the lower layer, wherein a deposition thickness d0 is the deposition thickness of the lower layer at the first step, a deposition thickness d2 is the deposition thickness of the upper layer on the first step and a deposition layer d3 is the deposition thickness of the upper layer at a portion other than the first step, and a taper angle $\theta 2$ of the upper layer are obtained from the equation below, $$\tan \theta 2 = (1 - d2/(d1-d0)) \tan \theta 1$$

$$d2 = (d1-d0)(1-\tan \theta 2/\tan \theta 1)$$

$$d3 = d1(1-\tan \theta 2/\tan \theta 1),$$

wherein d1 is a deposition thickness of the upper layer when the second taper angle of the upper layer becomes 0°.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

Figure 1A:
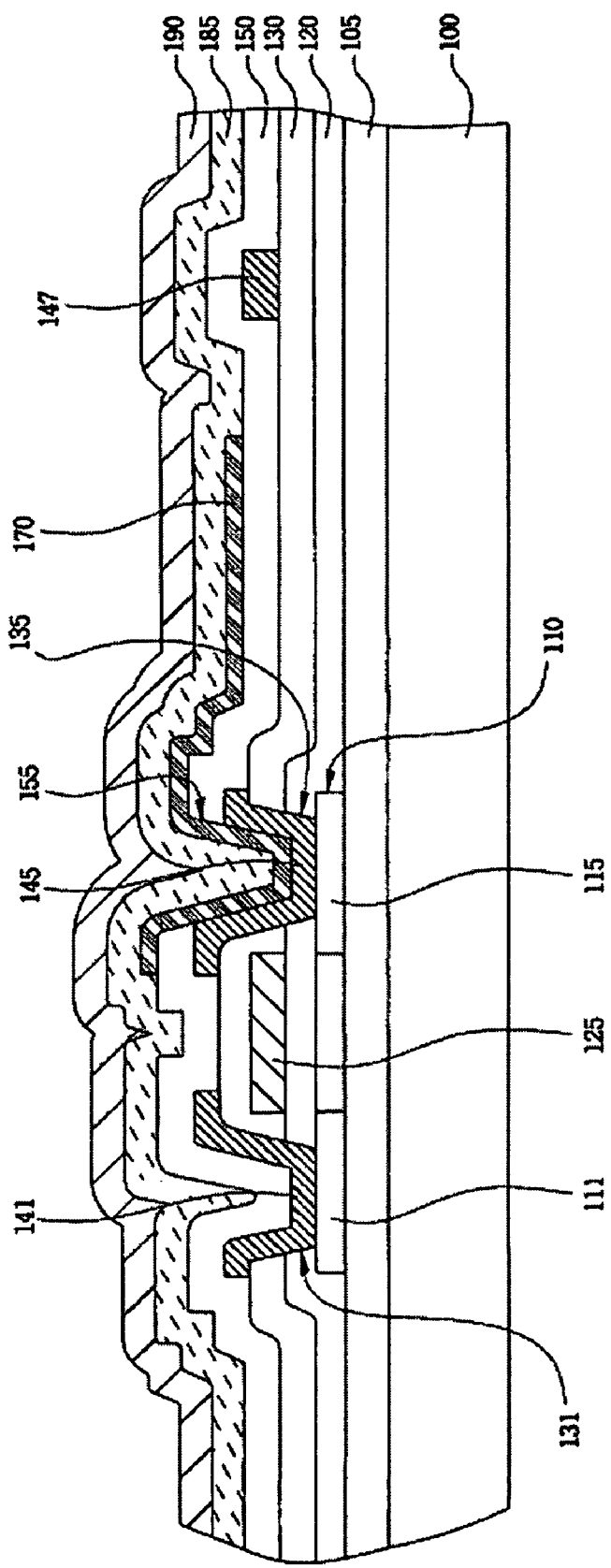
FIG. 1A illustrates a cross-sectional view of a conventional OLED.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 4:
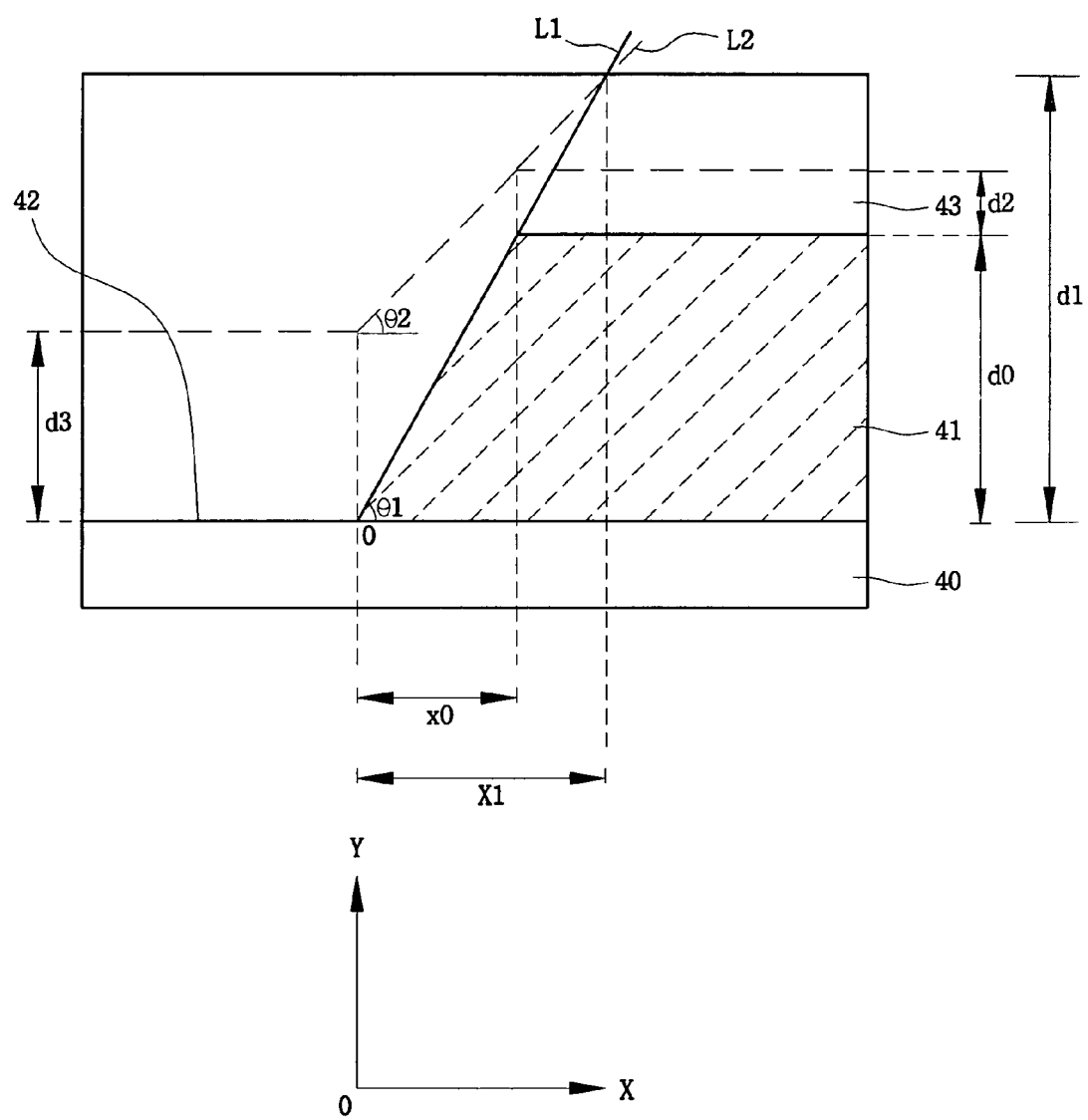
FIG. 4 illustrates a cross-sectional view of an OLED employing a taper reducing layer according to an embodiment of the present invention.

FIG. 4 illustrates a cross-sectional view of an OLED having a taper angle reduced by a taper reducing layer of the present invention. Referring to FIG. 4, an insulating substrate 40 has a lower layer 41 having an opening 42 for exposing a portion of the insulating substrate 40. The lower layer 41 has a predetermined taper angle with respect to an upper surface of the substrate at an edge of the opening 42. Furthermore, the lower layer 41 has a predetermined step d0 with respect to the upper surface of the substrate.

A taper reducing layer 43 having a taper angle $\theta 2$ is formed on the lower layer 41 and the opening 42. The deposition thickness of the taper reducing layer 43 may depend on the step of the substrate surface where the taper reducing layer is deposited. In other words, the taper reducing layer deposited on a portion where the substrate surface has a high step is deposited thinner than the taper reducing layer deposited on a portion where the substrate surface has a low step. Thus, the taper reducing layer 43 has a thickness of d2 on the lower layer having the step d0, and has a thickness of d3, thicker than d2 on the opening 42, for exposing the substrate. Since the thickness of the taper reducing layer 43 depends on the step of the substrate surface, the taper reducing layer 43 has a taper angle smaller than the taper angle at the lower layer 41. As a result, the taper reducing layer 43 has a taper angle θ2 smaller than the taper and θ1 of the lower layer 41.

In the OLED of an embodiment of the present invention, when the lower layer 41 is an insulating layer, such as an inter-layer insulating layer and a gate insulating layer, the opening 42 is a contact hole and exposes some portions of the source and drain regions. Thus, the taper angle of the lower layer 41 becomes θ1, and the step formed by the contact hole in the insulating layer, with respect to the substrate surface, is d0.

When the lower layer 41 is a passivation layer, the opening 42 is a via hole and exposes a portion of the source and drain regions. Thus, the taper angle of the via hole becomes θ1, and the step formed by the via hole in the passivation layer with respect to the substrate surface is d0. When the lower layer 41 is a pixel defining layer, the opening 42 exposes a portion of a pixel electrode. Thus, the taper angle of the pixel defining layer at the edge of the opening becomes θ1, and the step formed by the opening in the pixel defining layer with respect to the substrate surface is d0.

When the taper reducing layer 43 is formed within the contact hole, via hole, or opening of the pixel electrode, a conductive layer is formed over and below the taper reducing layer 43, so that the taper reducing layer 43 is formed, for example, of a conductive material. An organic layer that has a charge transporting capability and may be coated by a wet coating method may be used for the taper reducing layer 43. The taper reducing layer 43 may consist of at least one organic layer selected from a polymer organic layer, a small-molecule organic layer or similar material. The small-molecule organic layer for the taper reducing layer may be selected from carbazole-based, arylamine-based, hydrazone-based, stilbene-based, oxadiazole-based and starburst-based derivatives, and the polymer organic layer is selected from PEDOT, PANI, carbazole-based, arylamine-based, perylene-based, pyrrole-based and oxadiazole-based derivatives or similar materials.

In the above mentioned OLED, the principle that the taper angle is reduced by the taper reducing layer is as follows. The lower layer 41 has an opening 42, such as the contact hole, via hole, or opening region of the pixel defining layer, a step of d0 and a taper angle of θ1 with respect to the substrate surface, and a linear slope of tan θ1. The taper reducing layer 43 has a thickness of d2 on the lower layer 41 and d3 on the opening 42, a taper angle of θ2, and a linear slope of tan θ2 with respect to the substrate surface. In addition, the minimum thickness of the taper reducing layer required to planarize the substrate surface, i.e., the minimum thickness of the taper reducing layer 43 required to have its taper angle θ2 of zero degree with respect to the substrate surface, is d1.

Thus, the taper angle planarized by the taper reducing layer 43 becomes θ2, which is the taper angle of the taper reducing layer 43 in the opening 42. The taper angle before it is planarized is θ1, which is the taper angle of the lower layer 41 in the opening 42. When a straight line having a slope of tan θ1, formed by the taper angle θ1 of the lower layer 41, is assumed to be L1 and a straight line having a slope of tan θ2, formed by the taper angle θ2 of the taper reducing layer 43, is assumed to be L2, where L1 and L2 may be expressed as the equation 1 below. In this case, a point where the substrate surface and the straight line L1 meet, i.e., an edge portion of the opening 42, is an origin O, where a longitudinal direction of the substrate is an x axis, and a height direction of the substrate is a y axis.

$$L1: y1 = \tan\theta1 \, x$$

$$L2: y2 = \tan\theta2 + d3 \tag{1}$$

The straight line L1 passes the d0 at the position x0 of the x axis direction, and the straight line L2 passes the d0+d2 at a position x0 of the x axis direction. In addition, the lines L1 and L2 pass d1 at the position x1 of the x axis direction.

Thus, when functions y1 and y2 are substituted with values of the x and y axis directions in the equation 1, the result is as follows.

$$L1: d0 = \tan\theta1 \, x0$$

$$L2: d0 + d2 = \tan\theta2 \, x0 + d3$$

Thus, d0+d2 may be expressed as the equation 2 below.

$$d0 + d2 = (\tan\theta2/\tan\theta1) d0 + d3 \tag{2}$$

In addition, $$L1: d1 = \tan\theta1 \, x1$$

$$L2: d1 = \tan\theta2 \, x1 + d3$$

Therefore, d1 may be expressed as the equation 3 below.

$$d1 = (\tan\theta2/\tan\theta1) d1 + d3 \tag{3}$$

From the equations 2 and 3, a relationship equation with respect to the taper angle θ2 of the taper reducing layer 43 is obtained from the equation 4 below. Thickness d2 and thickness d3 of the taper reducing layer 43 to be deposited on the lower layer 41 and the opening 42, respectively, are obtained from equations 5 and 6 below. The thickness d2 of a portion of the taper reducing layer 43 formed on the lower layer 41 may linearly increase until the thickness d1−d0, that is, the thickness when the substrate surface is planarized from the surface of the lower layer 41. The thickness d3 of a portion where the taper reducing layer 43 is formed in the opening 42 may linearly increase until the thickness d1, namely, the thickness when the substrate surface is planarized from the surface of the opening 42. The minimum thickness d1 required to planarize the substrate surface may vary in accordance with the planarizing capability of the organic layer used for the taper reducing layer, and may be varied and experimentally obtained in accordance with viscosity and volatility of a solution, variables of a coating process, and the like.

$$\tan\theta2 = (1 - d2/(d1-d0))\tan\theta1 \tag{4}$$

$$d2 = (d1-d0)(1-\tan\theta2/\tan\theta1) = (d1-d0)(1-\alpha) \tag{5}$$

$$d3 = d1(1-\tan\theta2/\tan\theta1) = d1(1-\alpha) \tag{6}$$

In the above equations, α is a rate of a planarizing degree for the substrate surface when the taper reducing layer is formed on the substrate with respect to the planarizing degree of the substrate surface when the lower layer by itself is formed on the substrate. The value is defined as a relative flatness, and is expressed as $\alpha = \tan\theta2/\tan\theta1$.

For example, the lower layer 41 is an insulating layer having a via hole as the opening 42 and has a thickness of 6000 Å and a taper angle θ1 of 75° in the via hole. When the minimum thickness d1 is experimentally assumed to be 8000 Å to entirely planarize the via hole, the angle θ2 with which the substrate surface is planarized by the taper reducing layer 43 and the thickness d3 of the taper reducing layer 43 in the via hole are calculated as described below from the equations 4 and 6 above, to have the taper reducing layer 43 with 1000 Å in thickness to be deposited on the lower layer 41.

tan θ2=(1−1000/2000)tan 75=0.5*3.73=1.87

The taper angle θ2 of the taper reducing layer 43 in the via hole is as follows.

θ2=tan$^{-1}$(1.87)=62°.

In addition, the thickness d3 of the taper reducing layer 43 in the via hole is as follows.

d3=d1(1−tan θ2/tan θ1)=d1*d2/(d1−d0)=8000*1000/2000=4000

Thus, when the taper angle of the via hole is 75° and the thickness of the taper reducing layer 43 formed on the lower layer 41 is 1000 Å, the thickness d3 of the taper reducing layer 43 formed in the via hole becomes 4000 Å.

In the meantime, when the taper reducing layer 43 is deposited to have the angle planarized by the taper reducing layer 43, namely, the taper angle θ2 of the taper reducing layer 43 in the via hole to be below 40° or less, the thickness d2 of the taper reducing layer formed on the lower layer 41 and the thickness d3 of the taper reducing layer formed in the via hole are obtained as follows from the equations 5 and 6 d2=2000(1−tan 40/tan 75)=2000(1−0.23)=1540 d3=8000(1−tan 40/tan 75)=8000(1−0.23)=6160

In other words, when the taper reducing layer 43 in the via hole is formed to have the taper angle θ2 of 40°, it may be arithmetically seen that the taper reducing layer 43 is formed with 1540 Å on the lower layer 41 and with 6160 Å in the via hole.

Figure 5A:
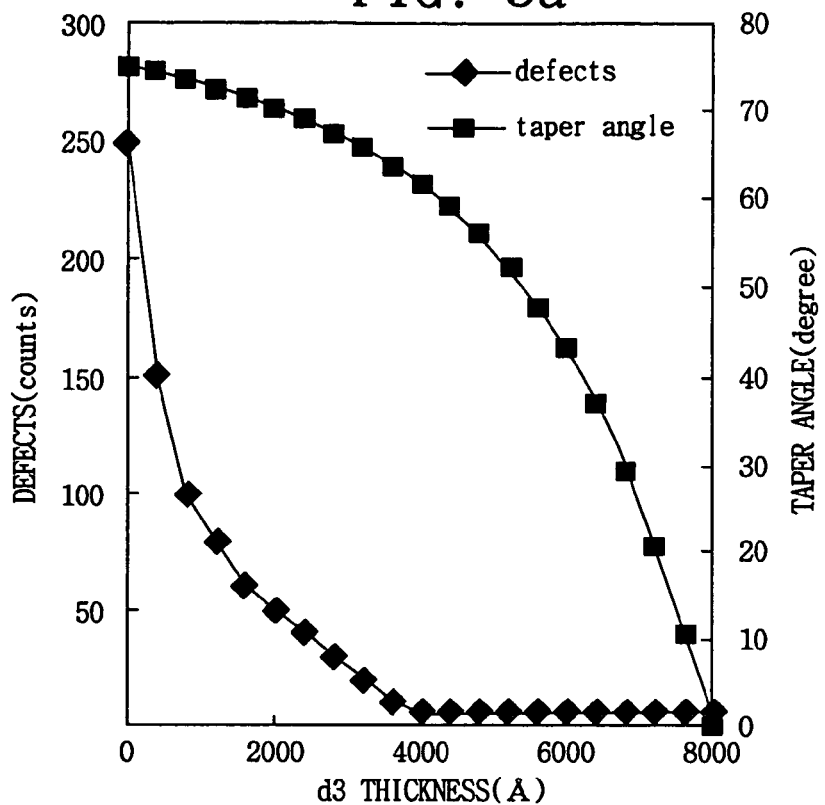
FIG. 5A illustrates a relationship between taper angle and defect generation rate in an OLED.
Figure 5B:
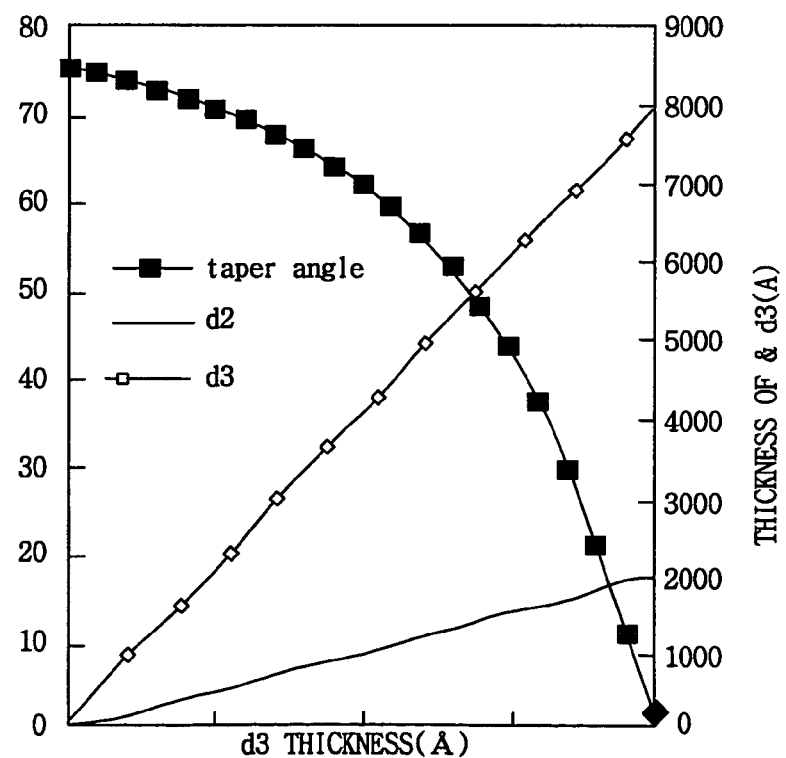
FIG. 5B illustrates a relationship between the taper angle and the thickness of the taper reducing layer in the OLED shown in FIG. 4.

FIG. 5A shows the number of defects in accordance with the taper angle of the via hole or contact hole. Referring to FIG. 5A, the smaller the taper angle of the via hole or the contact hole becomes, the fewer defects in the element. It may be seen that when the taper angle of the contact hole or via hole is 60° or less, an initial defect becomes significantly reduced, thereby enabling fabrication of a more reliable element. In this case, the initial defect may include a defect such as a dark pixel that occurred before driving the OLED. When the taper angle of the via hole or contact hole is 60°, the thickness d2 of a portion where the taper reducing layer 43 is formed on the lower layer 41 becomes 1000 Å and the thickness d3 of a portion where the taper reducing layer 43 is formed in the opening becomes 4000 Å, from the equations 5 and 6, FIG. 5B shows a relationship between the taper angle θ2 and the thickness d3 of the taper reducing layer formed in the opening when the lower layer 41 formed on the substrate has a predetermined taper angle θ1 and a step d1. Referring to FIG. 5B, when the 6000 Å thick lower layer 41 has a taper angle of 75° and the taper reducing layer 43 is formed with a thickness d1 of at least 8000 Å to planarize the substrate surface, the taper angle θ2 of the opening should be 40° or less when a pixel defining layer exists, and the taper angle θ2 of the contact hole or via hole should be is 60° or less when a pixel defining layer does not exist, in order to fabricate a reliable element.

To reduce the taper angle of the taper reducing layer as an organic layer having a planarizing characteristic, as well as to prevent light emitting characteristic from deteriorating in accordance with usage of the taper reducing layer, a high increase in driving voltage should be avoided when the taper reducing layer 43 is formed with a thickness d2 of about 1000 Å to about 2000 Å on the lower layer 41.

Thus, the taper reducing layer used in an exemplary embodiment of the present invention preferably has a planarizing characteristic, a charge transporting capability for transporting a hole or an electron, and a proper HOMO (highest occupied molecular orbital) and LUMO (lowest unfilled molecular orbital), so that it does not increase the driving voltage of the element due to an increased deposition thickness of the taper reducing layer.

In the case of a typical bottom-emitting or top-emitting OLED, where the taper reducing layer is formed below the emission layer and over the anode electrode, an organic layer having a hole transporting capability may be used, with an HOMO of 4.5 eV or more, and charge mobility of $10^{-8}$ cm$^2$/Vs or more for the taper reducing layer. In the case of an inverted-type OLED, where the taper reducing layer is formed over the cathode electrode and below the emission layer, an organic layer having an electron transporting capability may be used, with an LUMO of 3.5 eV or less, and charge mobility of $10^{-8}$ cm$^2$/Vs or more for the taper reducing layer.

Referring to FIG. 4, the taper reducing layer is employed to an insulating layer having an opening to reduce a taper angle. However, the taper angle may be reduced by the taper reducing layer even in a stepped portion of the deposition layer, so that element defects may be prevented.

Figure 6A:
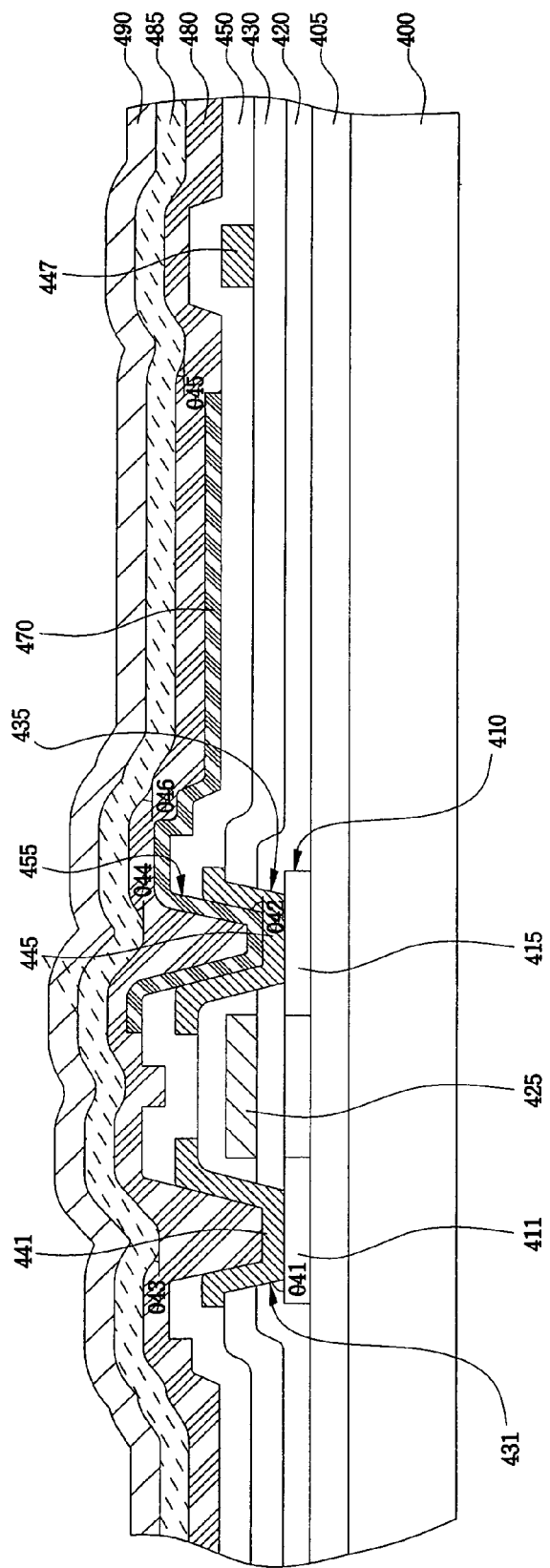
FIG. 6A illustrates a cross-sectional view of a bottom-emitting AMOLED in accordance with an embodiment of the present invention.

FIG. 6A shows a cross-sectional view of a bottom-emitting OLED having a taper reducing layer in accordance with an embodiment of the present invention. Referring to FIG. 6A, a buffer layer 405 is formed on an insulating substrate 400, and a semiconductor layer 410, having source and drain regions 411 and 415, is formed on the buffer layer 405. A gate 425 is formed on a gate insulating layer 420, and source and drain regions 441 and 445 are connected to the source and drain regions 411 and 415 through contact holes 431 and 435 on an inter-layer insulating layer 430. Wiring 447, such as a data line or a power supply line, is formed at the same time the source and drain electrodes 441 and 445 are formed on the inter-layer insulating layer 430. The contact holes 431 and 435 have a taper angle of 75° and a depth of 5000 Å.

An anode electrode 470, as a lower electrode connected to one of the source and drain electrodes 441 and 445, for example, to the drain electrode 445 through the via hole 455, is formed on a passivation layer 450. The via hole 455 may have a taper angle of 85° and a depth of 5000 Å, and the anode electrode 470 may have a thickness of 1000 Å. After forming the anode electrode 470, a cleaning process is performed. A taper reducing layer 480, an organic film layer 485 and a cathode electrode 490 may be sequentially formed on the substrate.

Figure 6B:
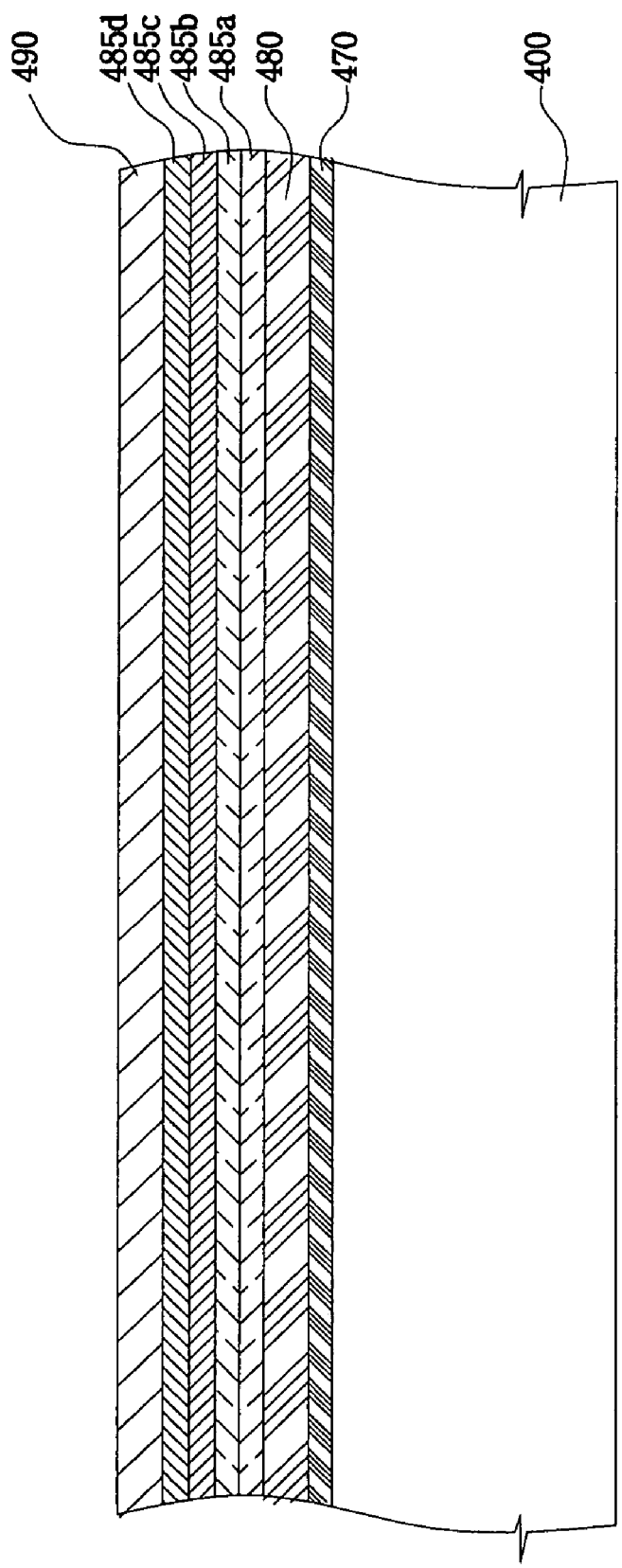
FIG. 6B illustrates a cross-sectional view of the emission region of one pixel in the bottom-emitting AMOLED shown in FIG. 6A.

FIG. 6B illustrates a cross-sectional view of an emission region of an R pixel in an OLED in accordance with an embodiment of the present invention. Referring to FIG. 6B, the taper reducing layer 480 is formed on the anode electrode 470, and an emission layer 485c is formed on the taper reducing layer 480.

By way of an exemplary embodiment, a polymer organic layer having a hole transporting capability, such as, for example, PEDOT is formed with a thickness of 1000 Å on the anode electrode 470 by a spin coating method, and an annealing process is performed by using a hot plate for 5 minutes at 200 Å, thereby forming the taper reducing layer 480. In this case, the deposition thickness of the taper reducing layer 480 is determined by its taper angle, the depths and taper angles of the contact hole and via hole below the taper reducing layer, the thickness of the pixel electrode and a taper angle at an edge of the pixel electrode.

Using a vacuum deposition method, a 600 Å thick CuPc, as the hole injecting layer 485a, and a 300 Å thick NPB, as the hole transporting layer 485b, are sequentially formed on the taper reducing layer 480. A 200 Å thick Alq+DCM, as the red color emission layer 485c, is deposited on the hole transporting layer 485b, and a 200 Å thick Alq$_3$, as the electron transporting layer 485d, is formed on the red emission layer 485c, thereby forming the organic film layer 485. In the present embodiment, a hole blocking layer between the red color emission layer 485c and the electron transporting layer 485d, and an electron injecting layer on the electron transporting layer 485d may be formed. Finally, LiF/Al, as the cathode electrode 490, is deposited by a thermal evaporation method.

After forming the organic film layer 485 and the cathode electrode 490, as shown in FIG. 6B, a sealant (not shown in the figures) is applied on the insulating substrate 400 to prevent external oxygen and moisture from being introduced inside. An encapsulating substrate is bonded thereon, thereby fabricating the OLED.

Figure 6C:
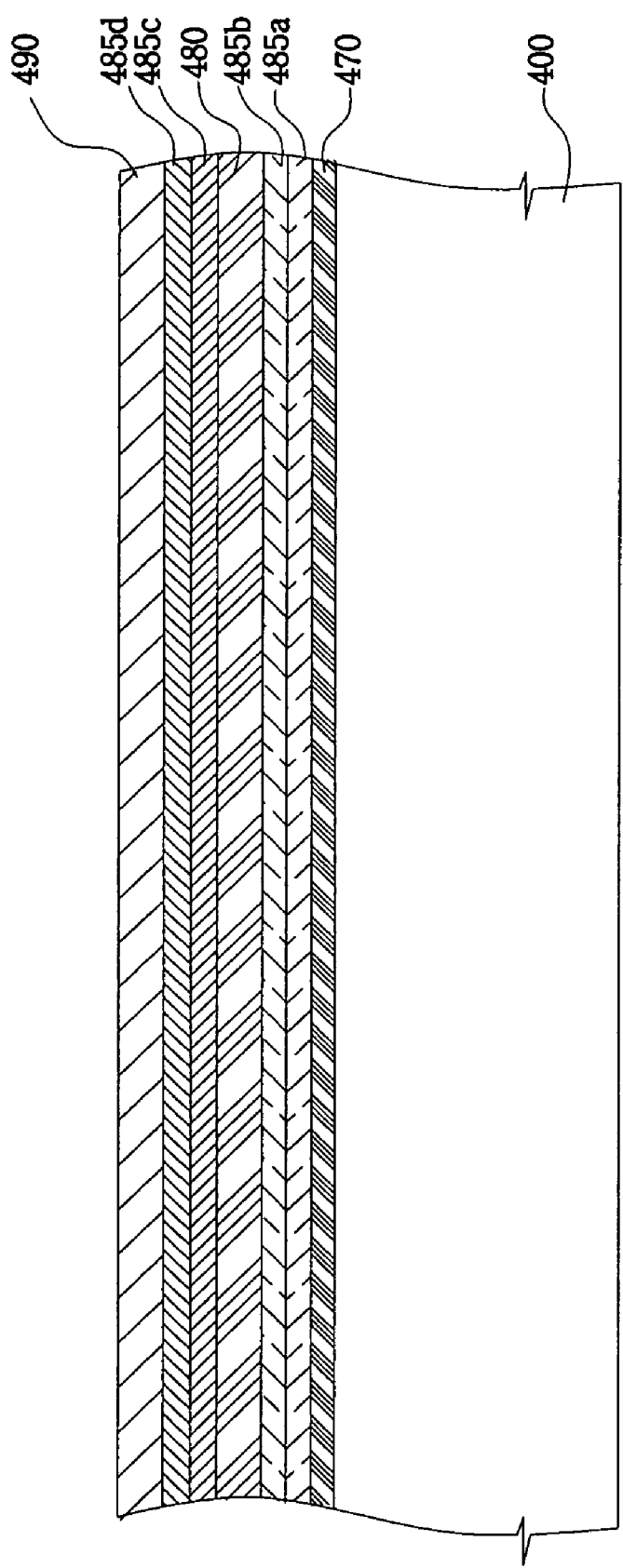
FIG. 6C illustrates a cross-sectional view of the emission region of one pixel in the bottom-emitting AMOLED shown in FIG. 6A.

FIG. 6C illustrates another cross-sectional view of the emission region of the R pixel in the OLED in accordance with an embodiment of the present invention. Referring to FIG. 6C, the taper reducing layer 480 is formed between the emission layer 485c and the hole transporting layer 485b of the organic film layer 485.

The anode electrode 470 is formed on the insulating layer 400, and the hole injecting layer 485a and the hole transporting layer 485b of the organic film layer 485 are sequentially formed on the anode electrode 470. The taper reducing layer 480 is formed on the hole transporting layer 485b, the R emission layer 485c and the electron transporting layer 485d, as the organic emission layer 485 are sequentially formed on the taper reducing layer 480. The cathode electrode 490 is formed on the electron transporting layer 485d.

The taper reducing layer 480 may be formed just on the anode electrode 470 and below the emission layer 485c, as shown in FIGS. 6B and 6C, and at the same time, may be formed only between the anode electrode 470 and the emission layer 485c of the organic film layer 485. The organic film layer 485 has at least one of a hole injecting layer, a hole transporting layer, an emission layer, a hole blocking layer, an electron transporting layer and/or an electron injecting layer.

In the first exemplary embodiment, the contact hole 431 and the via hole 455 have taper angles ($\theta$41, $\theta$42) of 75° and 85°, respectively, before forming the taper reducing layer 480. The taper angle is reduced with respect to the substrate 400 surface after the taper reducing layer 480 is formed, so that the taper angles ($\theta$43, $\theta$44) of the contact hole 431 and the via hole 455 are 60° or less. The anode electrode 470 has an edge taper angle and the taper reducing layer 480 may reduce it to an edge taper angle ($\theta$45) of 40°. In addition, the taper angle ($\theta$46) may be reduced near the contact holes 431 and 435, near the via hole 455, and near the wiring 447 in accordance with formation of the taper reducing layer 480.

The deposition thickness of the taper reducing layer 480 is determined by the taper angle of the taper reducing layer, the depths and taper angles of the contact hole and via hole below the taper reducing layer, the thickness of the pixel electrode and the taper angle at an edge of the pixel electrode. When the taper reducing layer is deposited to have the taper angles of the contact hole or via hole of 60° or less, from FIG. 4 and equations 4 to 6, the deposition thickness of the taper reducing layer is determined by the taper angle of the contact hole and the thickness of the insulating layer, such as the inter-layer insulating layer and the gate insulating layer where the contact hole is formed, and further determined by the taper angle of the via hole and the thickness of the insulating layer, such as the passivation layer where the via hole is formed. In the meantime, when the taper reducing layer is deposited to have the taper angle at an edge of the pixel electrode of 40° or less, the deposition thickness of the taper reducing layer is determined by the taper angle at an edge of the pixel electrode and the thickness of the pixel electrode, from FIG. 4a and equations 4 to 6.

Figure 1B:
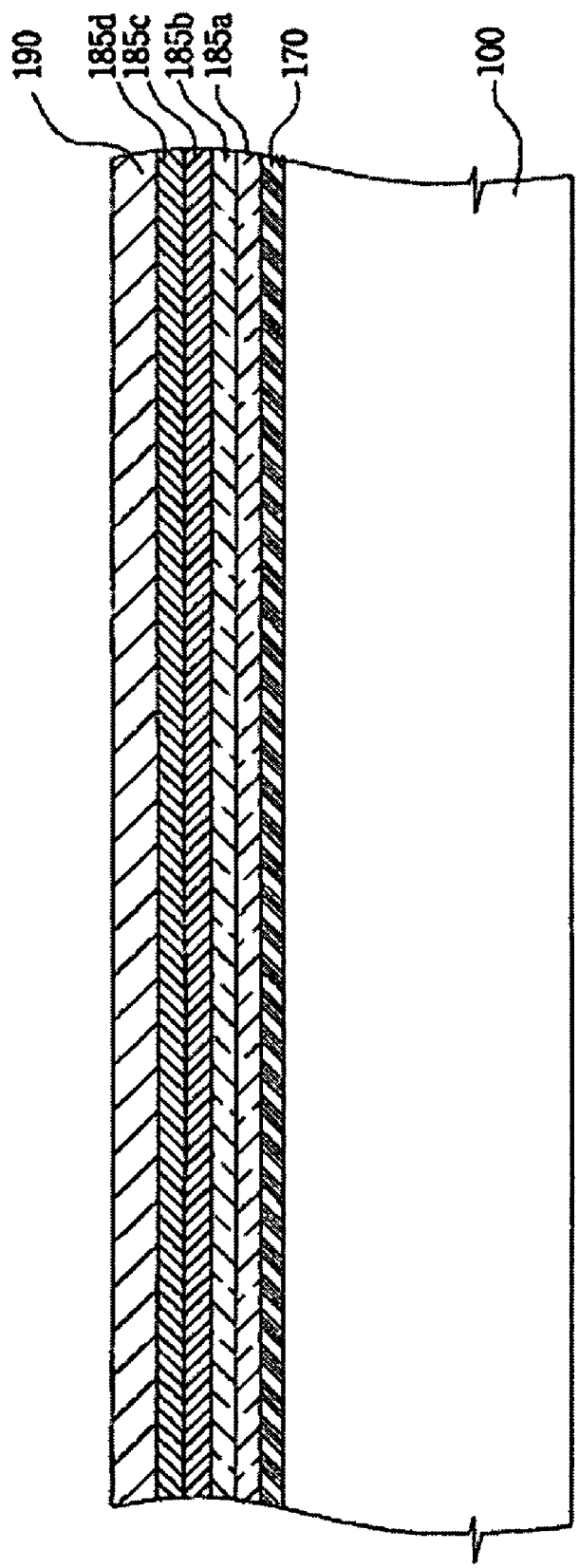
FIG. 1B illustrates a cross-sectional view of an emission region of one pixel in the OLED shown in FIG. 1A.
Figure 2:
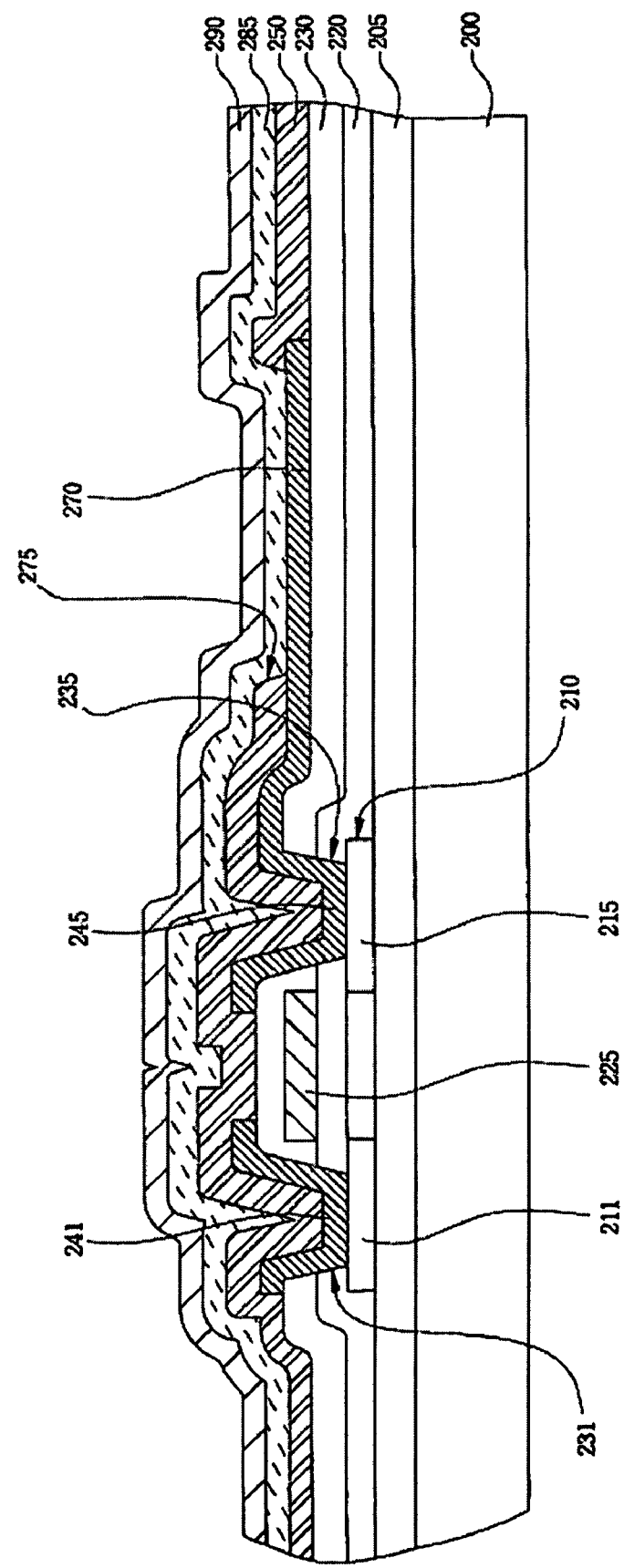
FIG. 2 illustrates a cross-sectional view of a conventional OLED having a pixel defiling layer.
Figure 3:
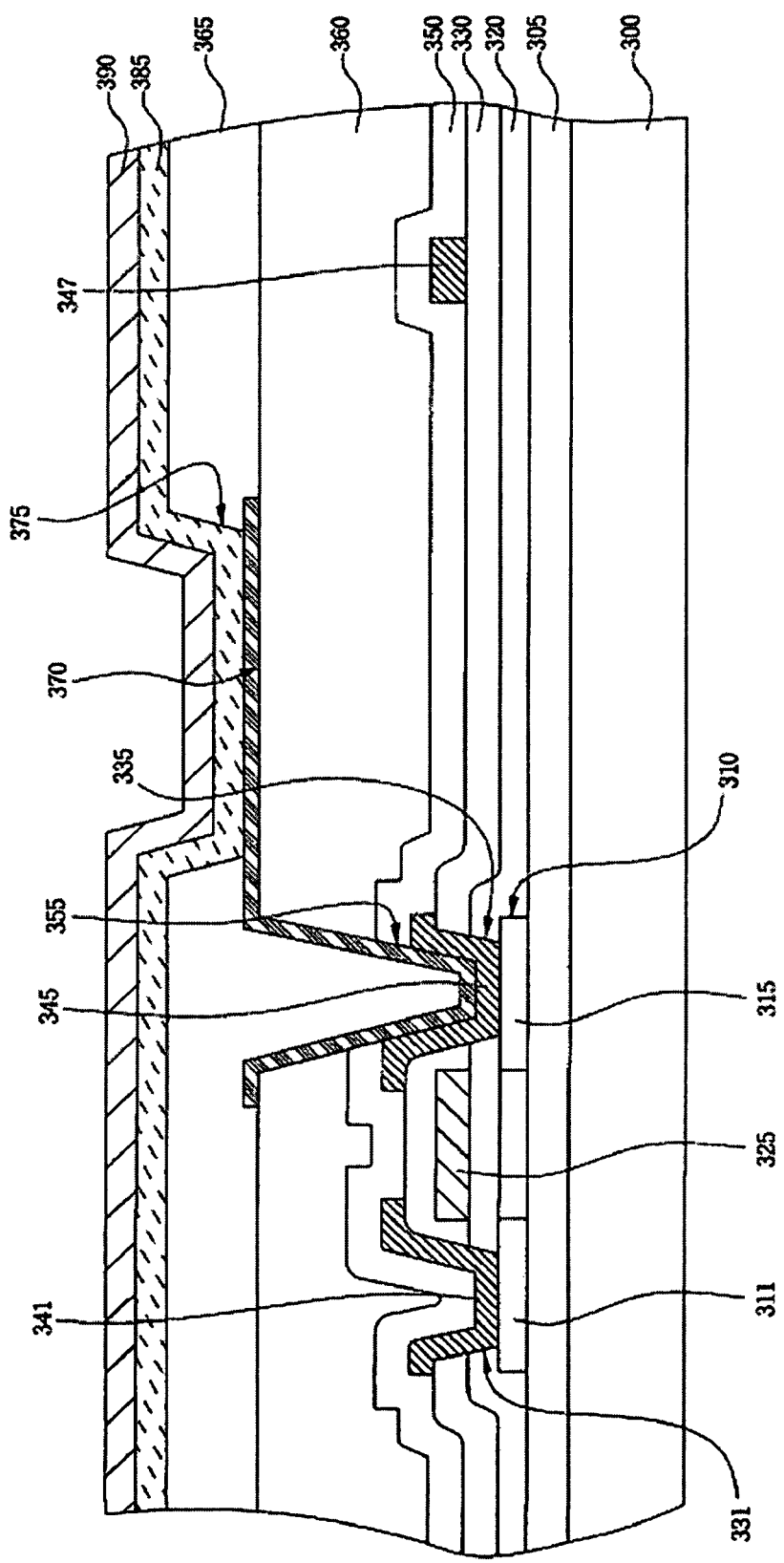
FIG. 3 illustrates a cross-sectional view of a conventional OLED having a passivation layer where the edge is tapered.
Figure 7A:
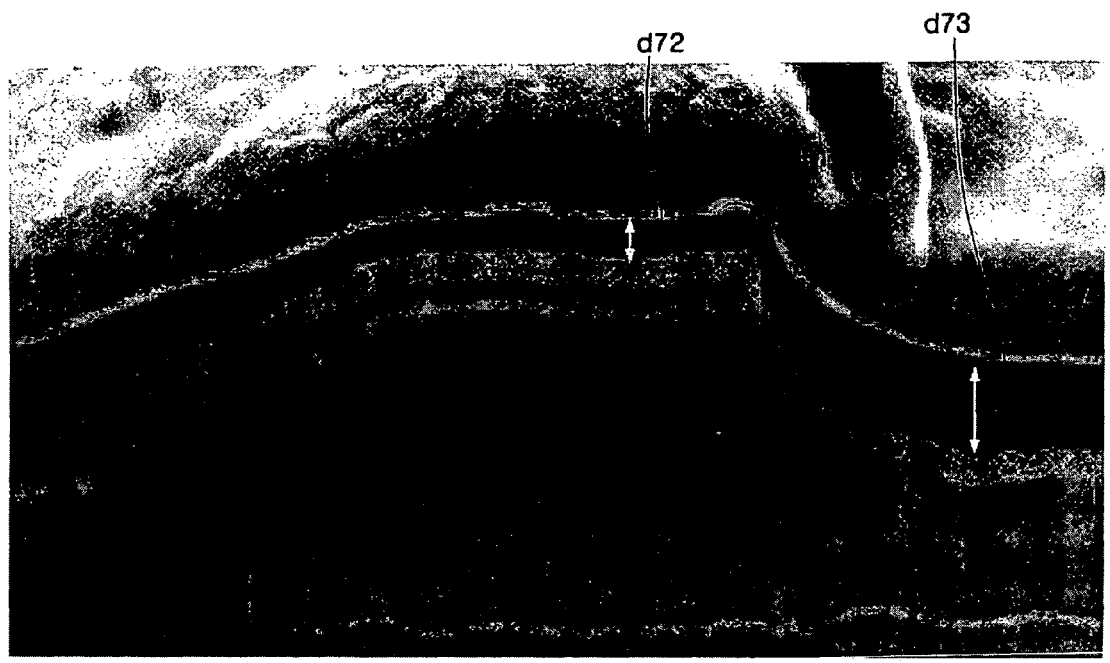
FIG. 7A illustrates the reduced taper angle by the taper reducing layer in the AMOLED shown in FIG. 6A.
Figure 7B:
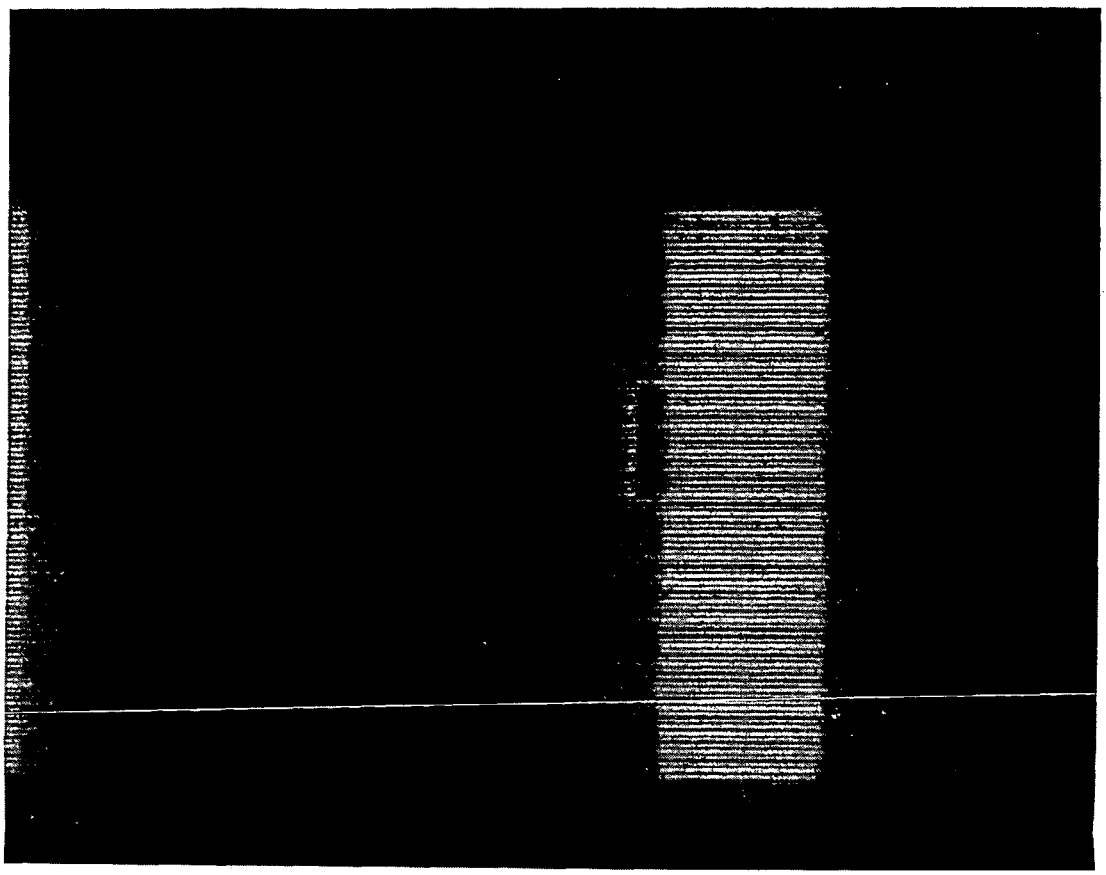
FIG. 7B illustrates a pixel that the dark spot is not occurred in the AMOLED shown in FIG. 6A.
Figure 7C:
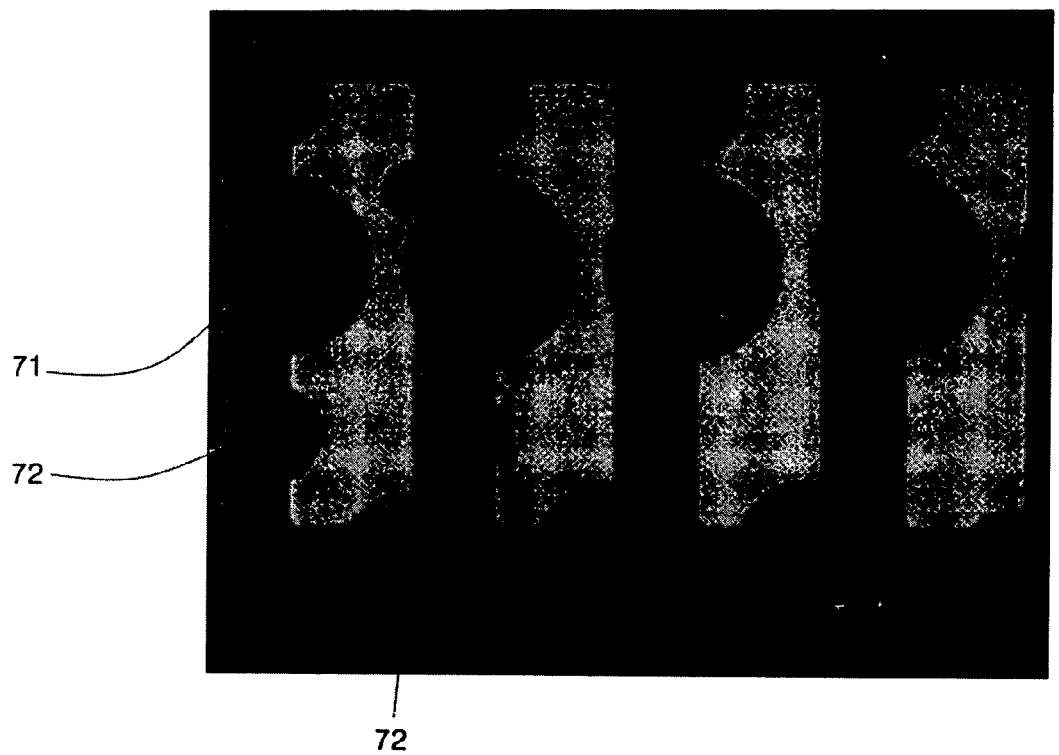
FIG. 7C illustrates that defects occur in the pixel when the taper reducing layer is not employed in the conventional bottom-emitting OLED.

FIG. 7A illustrates a SEM picture near the via hole in the OLED in accordance with a first exemplary embodiment of the present invention. Referring to FIG. 7A, a portion with a thickness d73 where the taper reducing layer is formed on the anode electrode within the via hole is deposited thicker than a portion with a thickness d72 where the taper reducing layer is formed on the anode electrode over an insulating layer having a stepped portion, so that the taper angle in the via hole is reduced to 50°. FIG. 7B illustrates a microscope picture for representing whether edge defects occur in the emission region when the OLED of the first exemplary embodiment is driven. Referring to FIG. 7B, when the substrate surface is planarized by the taper reducing layer, so that the taper angle is reduced at an edge of the pixel, defects may be reduced or eliminated at an edge of the emission region. FIG. 7C illustrates a microscope picture for representing whether the edge defects occur at an edge of the emission region when the OLED having the same structure as shown in FIGS. 1A and 1B is driven. Referring to FIG. 7C, it may be seen that dark spots may occur at an edge of the emission region when the taper reducing layer is not used. In this case, a numerical reference 71 indicates the dark spot near the via hole, and 72 indicates the dark spot near the contact hole.

Figure 8:
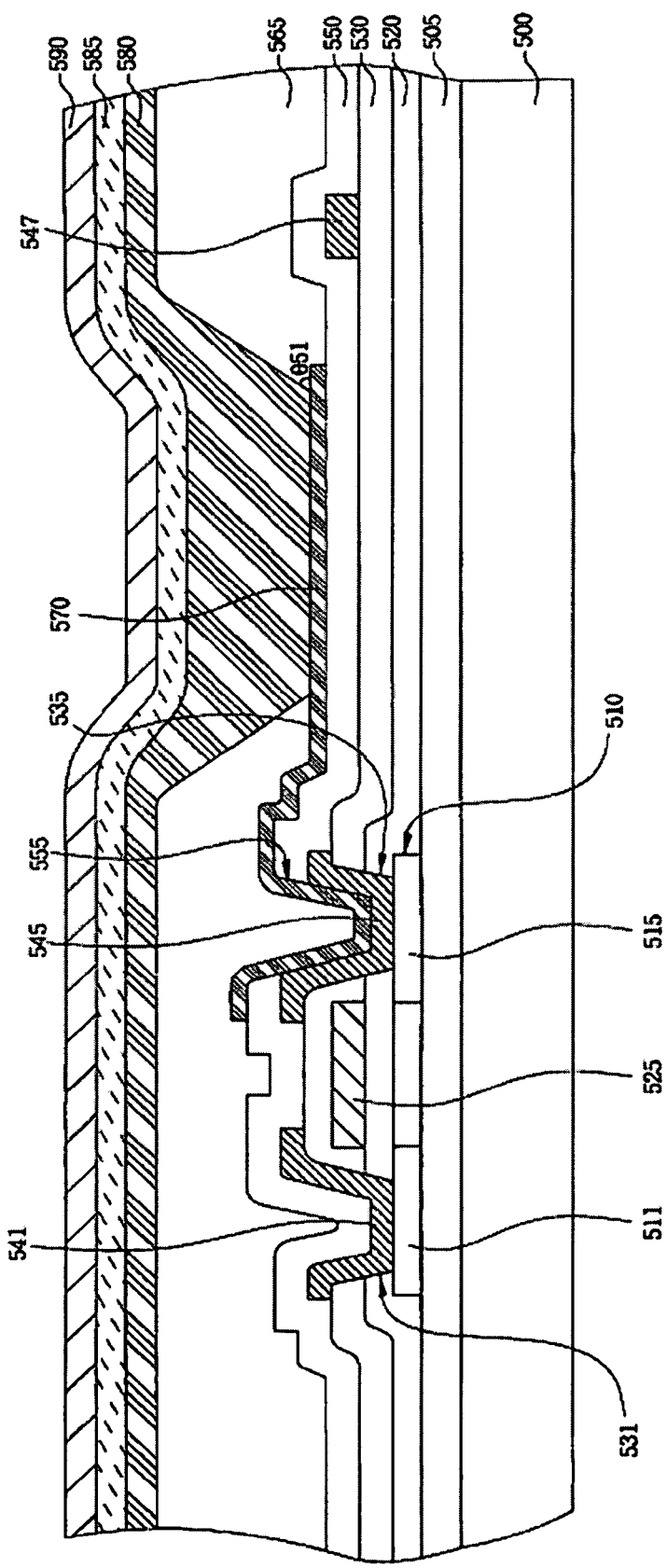
FIG. 8 illustrates a cross-sectional view of a bottom-emitting AMOLED having a pixel defining layer in accordance with an embodiment of the present invention.

FIG. 8 illustrates a cross-sectional view of a bottom-emitting OLED in accordance with a second exemplary embodiment of the present invention. Referring to FIG. 8, a buffer layer 505 is formed on an insulating substrate 500, and a semiconductor layer 510 having source and drain regions 511 and 515 is formed on the buffer layer 505. A gate 525 is formed on a gate insulating layer 520, and source and drain electrodes 541 and 545 are formed on an inter-layer insulating layer 530 through contact holes 531 and 535. In this case, a data line 547 is formed at the same time when the source and drain electrodes 541 and 545 are formed on the inter-layer insulating layer 530.

An anode electrode 570 as a lower electrode connected to one of the source and drain electrodes 541 and 545, such as, for example, to the drain electrode 545 through the via hole 555, is formed on the passivation layer 550. After depositing a 5000 Å thick pixel defining layer 565 over the entire substrate, this pixel defining layer is etched to have a taper angle $\theta$51 of 60° to form an opening 575. After forming the pixel defining layer 565, an organic layer, such as PEDOT, coated by a wet coating method and having a hole transporting capability, is deposited on the substrate, so that a taper reducing layer 580 is formed. In this case, the taper reducing layer 580 may have a taper angle $\theta$51 of the opening 575 of 40° or less, and the deposition thickness of the taper reducing layer 580 is determined by the taper angle of the taper reducing layer 580, thickness of the pixel defining layer 585 and the taper angle of the opening 575.

After depositing the organic film layer 585 on the taper reducing layer 580, such as in the first embodiment of FIG. 6A, and depositing LiF/Al for the cathode electrode 590 on the organic film layer 585 by the thermal evaporation method, an encapsulating substrate (not shown) is then bonded to fabricate the OLED in accordance with second exemplary embodiment of the present invention.

Figure 9A:
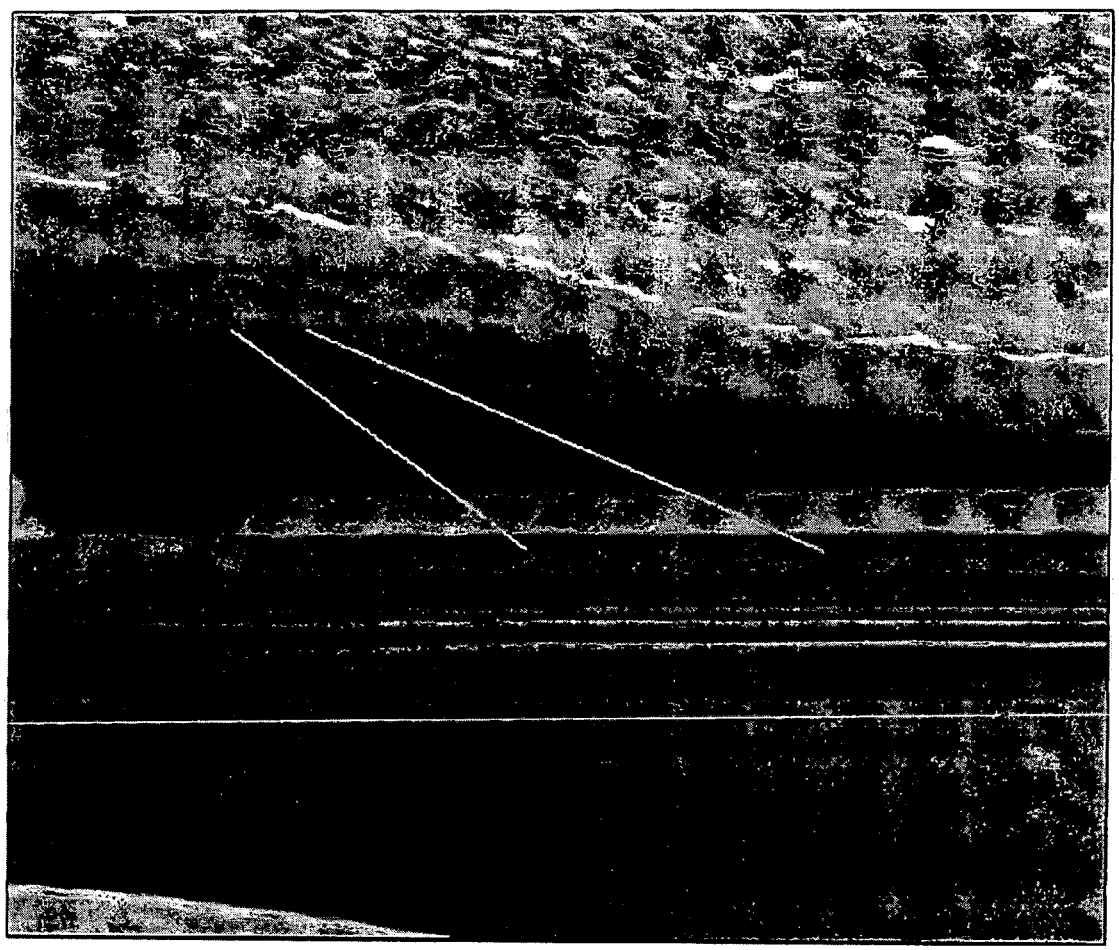
FIG. 9A illustrates that the taper angle is reduced by the taper reducing layer in the AMOLED shown in FIG. 8.

FIG. 9A illustrates a SEM picture near an emission region of an OLED in accordance with a second exemplary embodiment. Referring to FIG. 9A, it may be seen that the taper angle at an edge of the opening is reduced to 40° as the taper reducing layer is formed.

Figure 9B:
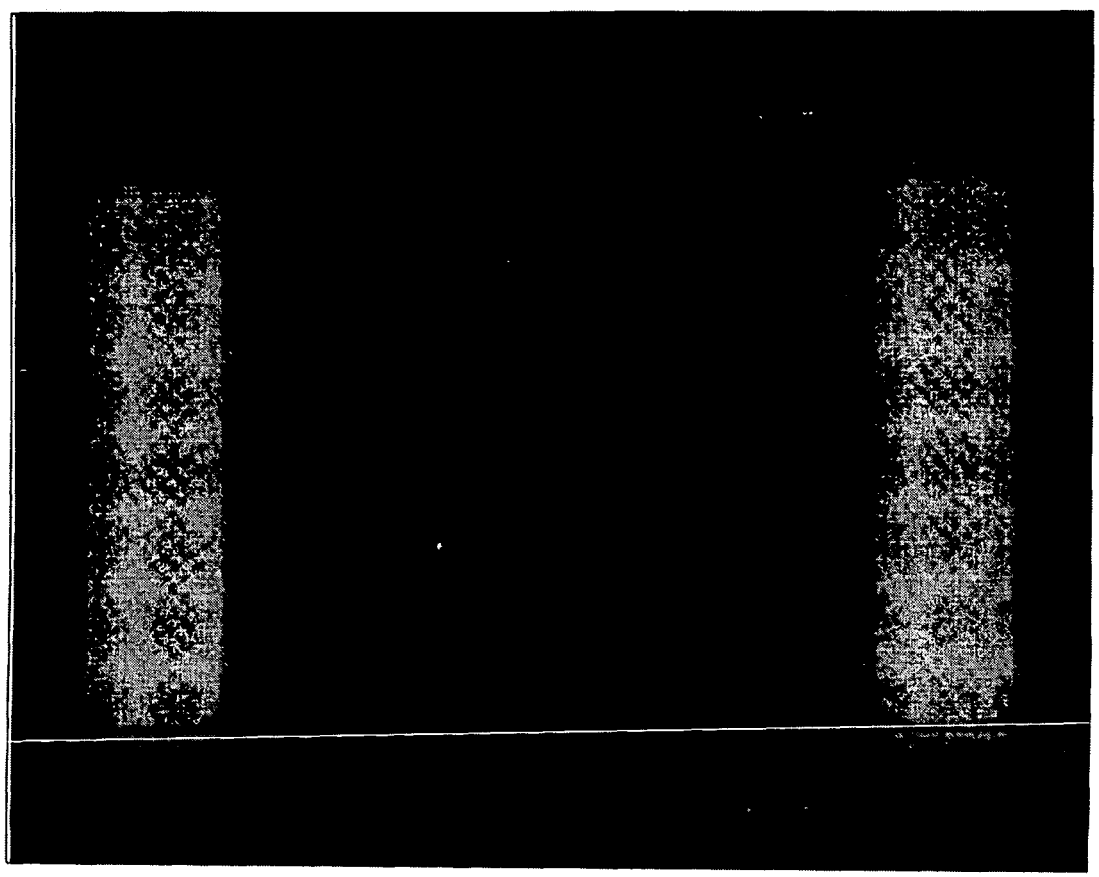
FIG. 9B illustrates a pixel that the dark spot is not occurred in the AMOLED shown in FIG. 8.
Figure 9C:
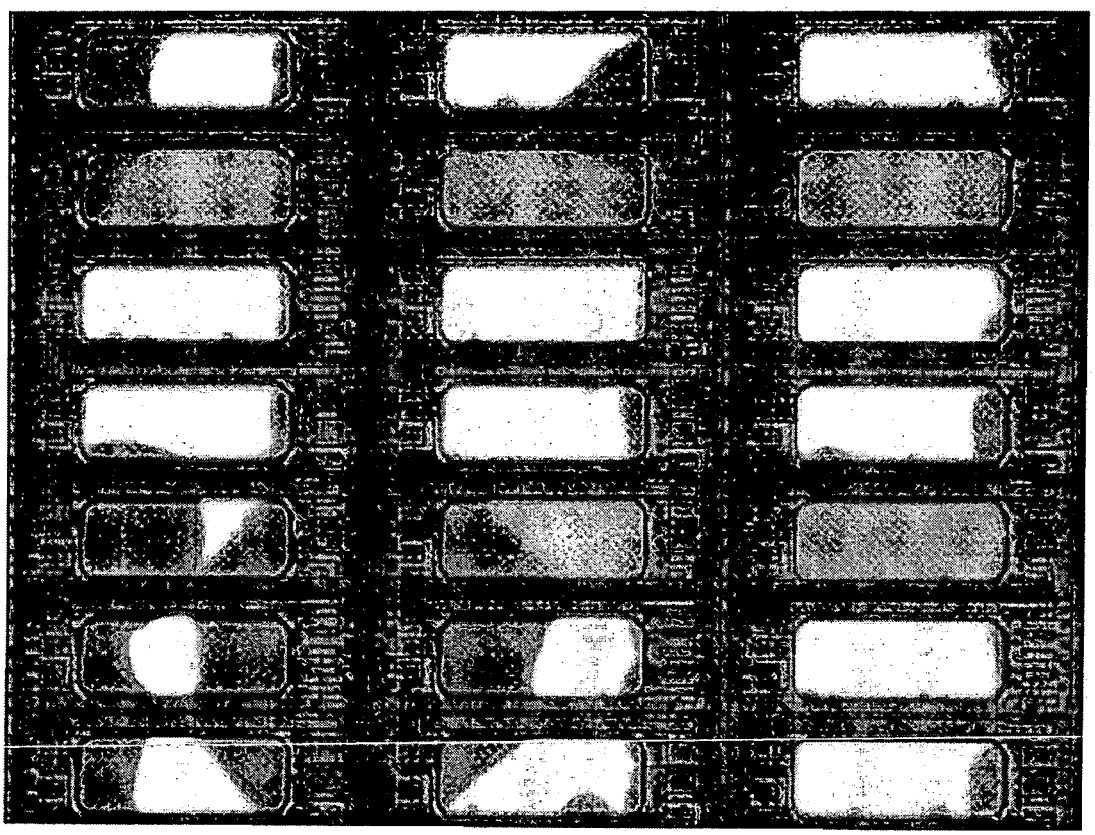
FIG. 9C illustrates a pixel where dark spots occur in an OLED having a conventional pixel defining layer.

FIG. 9B illustrates a microscope picture of an edge of the emission region when the OLED employing the taper reducing layer in accordance with the second exemplary embodiment is driven. Referring to FIG. 9B, it may be seen that defects, such as a dark spot at an edge of the emission region, may be reduced or eliminated by forming the taper reducing layer on the pixel defining layer. FIG. 9C illustrates a microscope picture at an edge of the emission region when the OLED, having the pixel defining layer and employing a conventional taper reducing layer, is driven. Referring to FIG. 9C, it may be seen that dark spots occur if the taper angle at an edge of the opening is large even when the pixel defining layer is used.

Figure 10:
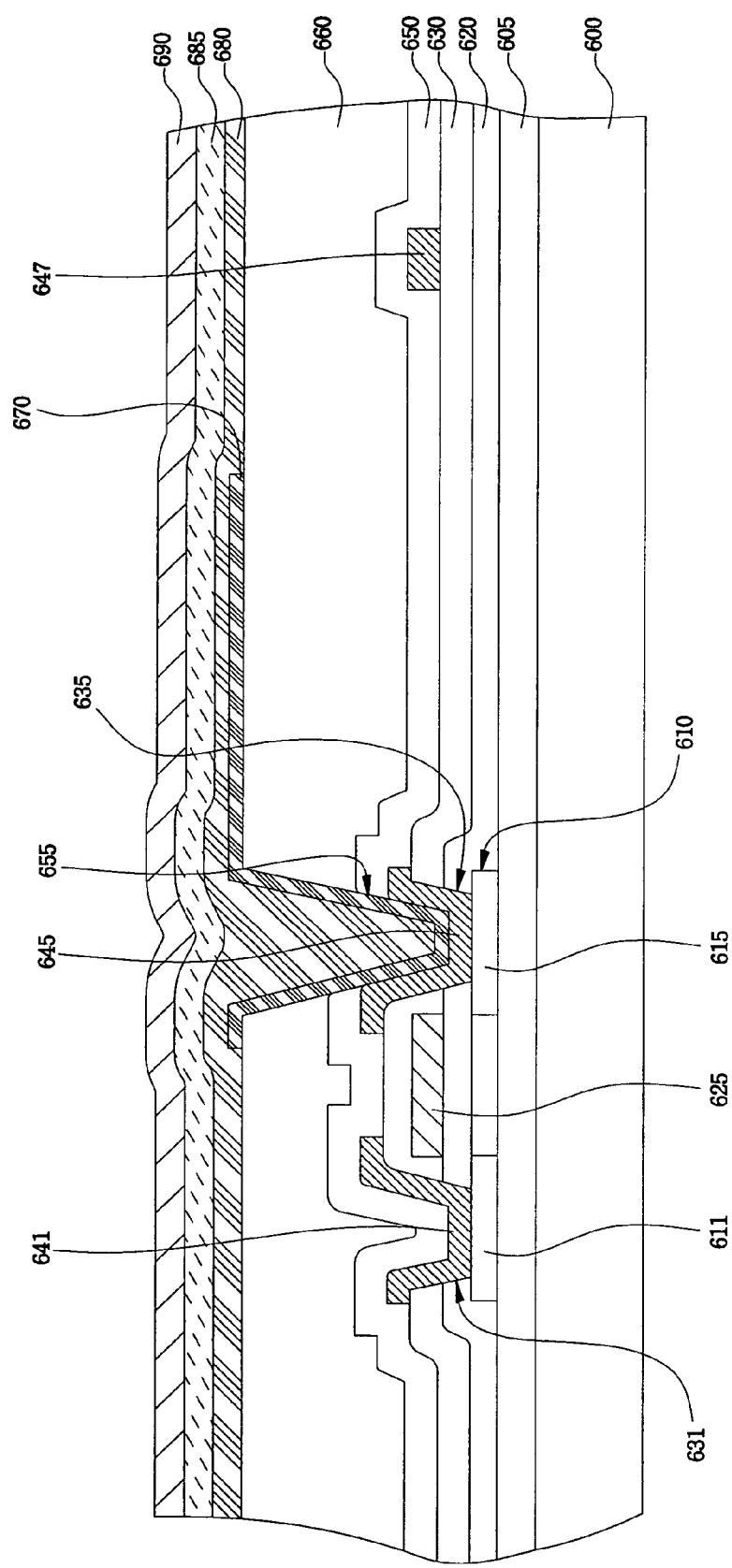
FIG. 10 illustrates a cross-sectional view of a top-emitting AMOLED in accordance with a third embodiment of the present invention.

FIG. 10 illustrates a cross-sectional view of a top-emitting OLED in accordance with a third exemplary embodiment of the present invention. Referring to FIG. 10, a buffer layer 605 is formed on an insulating layer 600, and a semiconductor layer 610 having source and drain regions 611 and 615 is formed on the buffer layer 605. A gate 625 is formed on a gate insulating layer 620, and source and drain electrodes 641 and 645 are formed on an inter-layer insulating layer 630 through contact holes 631 and 635. In this case, wiring 647, such as a data line or a power supply line, is formed when the source and drain electrodes 641 and 645 are formed on the inter-layer insulating layer 630.

A planarization layer 660 is formed on a passivation layer 650, and an anode electrode 670 as a lower electrode connected to one of the source and drain electrodes 641 and 645, such as, for example, to the drain electrode 645 through the via hole 655, is formed on the planarization layer 660. PEDOT as an organic layer that may be coated by a wet coating method and has a hole transporting capability is deposited on the substrate, may be used so that the taper reducing layer 680 is formed. In this case, the taper reducing layer 680 may have the taper angle of the via hole of 60° or less, and the deposition thickness of the taper reducing layer 680 is determined by the taper angle of the taper reducing layer, thickness of the planarization layer 660 and the taper angle of the via hole.

After forming an organic film layer 685 and a cathode electrode 690 as an upper electrode on the taper reducing layer 680, such as in the first exemplary embodiment, an encapsulating substrate (not shown in the figure) is then used to fabricate the OLED in accordance with the third exemplary embodiment.

Figure 11:
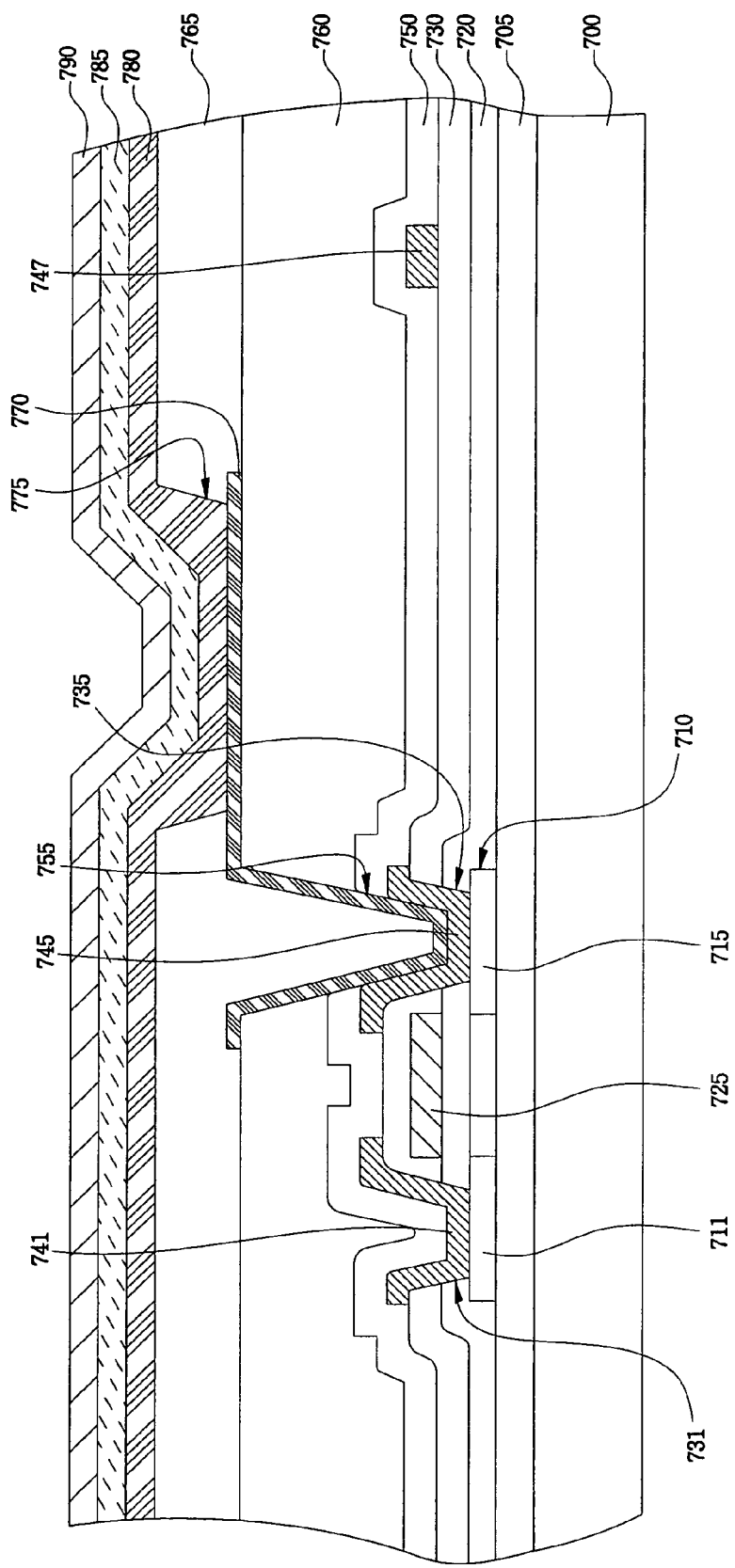
FIG. 11 illustrates a cross-sectional view of a top-emitting AMOLED having a pixel defining layer in accordance with a fourth embodiment of the present invention.

FIG. 11 illustrates a cross-sectional view of a top-emitting OLED in accordance with a fourth exemplary embodiment of the invention. Referring to FIG. 11, a buffer layer 705 is formed on an insulating substrate 700, and a semiconductor layer 710 having source and drain regions 711 and 715 is formed on the buffer layer 705. A gate 725 is formed on a gate insulating layer 720, and source and drain electrodes 741 and 745 are formed on an inter-layer insulating layer 730 through contact holes 731 and 735. In this case, wiring 747 such as a data line or a power supply line, is formed when the source and drain electrodes 741 and 745 are formed on the inter-layer insulating layer 730.

A planarization layer 760 is formed on a passivation layer 750, and an anode electrode 770 as a lower electrode connected to one of the source and drain electrodes 741 and 745, such as, for example, to the drain electrode 745 through the via hole 755, is formed on the planarization layer 760. A pixel defining layer 765, having an opening 775 for exposing a portion of the anode electrode 770, is then formed. PEDOT, as an organic layer that may be coated by a wet coating method and has a hole transporting capability, may be deposited on the substrate, so that the taper reducing layer 780 is formed. In this case, taper reducing layer 780 may have the taper angle of the opening 775 of 40° or less, and the deposition thickness of the taper reducing layer 780 is determined by the taper angle of the taper reducing layer, the thickness of the pixel defining layer and the taper angle of the pixel defining layer. After forming a cathode electrode 790 for an upper electrode and an organic film layer 785 on the taper reducing layer 780, such as in the first exemplary embodiment, an encapsulating substrate (not shown in the figure) is used to fabricate the OLED in accordance with the fourth exemplary embodiment.

Figure 12:
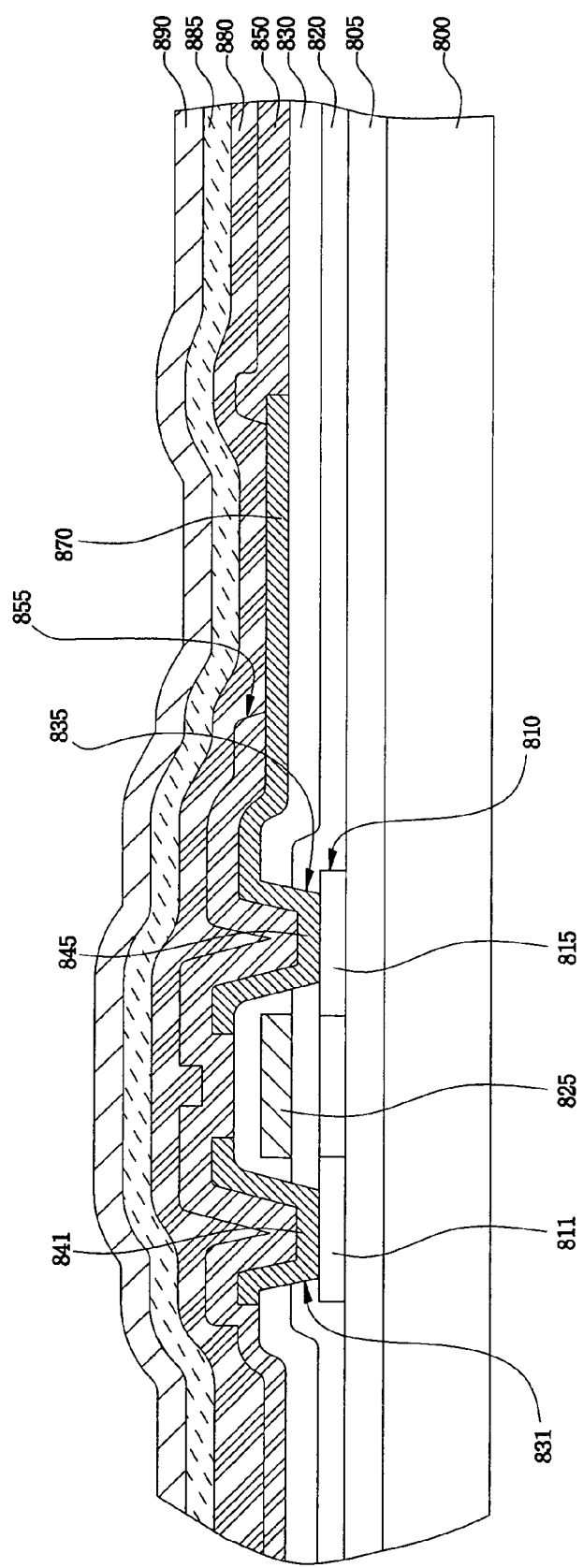
FIG. 12 illustrates a cross-sectional view of an AMOLED in accordance with an embodiment of the present invention.

FIG. 12 illustrates a cross-sectional view of a bottom-emitting OLED in accordance with a fifth exemplary embodiment of the present invention. Referring to FIG. 12, a buffer layer 805 is formed on an insulating substrate 800, and a semiconductor layer 810 having source and drain regions 811 and 815 is formed on the buffer layer 805. A gate 825 is formed on a gate insulating layer 820, and source and drain electrodes 841 and 845 are formed through contact holes 831 and 835 on an inter-layer insulating layer 830. In this case, an anode electrode 870 is formed to be connected to one of the source and drain electrodes 841 and 845, such as, for example, to the drain electrode 845 on the inter-layer insulating layer 830.

A passivation layer 850 having an opening 855 for exposing a portion of the anode electrode 870 is formed on the substrate. A taper reducing layer 880 formed of a conductive organic layer that may be coated by a wet coating method, such as, for example, PEDOT, is formed on the opening 855 and the passivation layer 850. The taper reducing layer 880 may have a taper angle in the opening of 40° or less, and the thickness of the taper reducing layer 880 is determined by the taper angle of the taper reducing layer 880, the thickness of the passivation layer 850 and the taper angle of the opening. After forming a cathode electrode 890 for an upper electrode and an organic film layer 885 on the taper reducing layer 880, such as in the first exemplary embodiment, an encapsulating substrate (not shown in the figure) is bonded to fabricate the OLED in accordance with the fifth exemplary embodiment.

In the exemplary embodiments of the present invention, the organic film layer has the hole injecting layer, the hole transporting layer, the R, G, or B organic emission layer and the electron transporting layer. However, it may have at least one of the hole injecting layer, the hole transporting layer, the R, G, or B organic emission layer, the hole blocking layer, the electron transporting layer and/or the electron injecting layer.

In the exemplary embodiments of the present invention, top and bottom-emitting OLEDs, where the organic emission layer is deposited on the anode electrode, use the organic layer having a hole transporting capability for the taper reducing layer. However, it is also possible to use the organic layer having the electron transporting capability for the taper reducing layer in the inverted-type OLED, where the organic emission layer is deposited on the cathode electrode.

In addition, the taper reducing layer is shown to be formed between the anode electrode and the organic film layer in the exemplary embodiments of the present invention. However, it is possible to form the taper reducing layer on any layer existing between the emission layer of the organic film layer and the anode electrode in the top and bottom-emitting OLEDs. It is also possible to form it on any layer existing between the emission layer of the organic film layer and the cathode electrode in the inverted-type OLED.

In addition, the method for reducing the taper angle of the substrate surface by using the taper reducing layer of the present invention may use various methods, such as, for example, but not limited to, a deposition method, an inkjet method and a laser-induced thermal imaging for forming the organic emission layer.

As mentioned above, by forming the organic film layer capable of reducing the taper angle between the organic emission layer and the lower electrode in accordance with the exemplary embodiments of the present invention, defects near the contact hole and via hole and at a stepped portion of the lower electrode and defects of the organic emission layer may be prevented, and reliability and the yield may also be improved.

While the present invention has been described with reference to various exemplary embodiments, it is understood that the disclosure has been made for purpose of illustrating the invention by way of examples and is not to limit the scope of the invention. One skilled in the art may amend and change the exemplary embodiments of the present invention without departing from the scope and spirit of the invention.

What is claimed is:

1. A flat panel display, comprising:
    an insulating substrate including a thin film transistor having at least source and drain electrodes;
    an insulating layer formed on the insulating substrate and having a via hole to expose one of the source and drain electrodes;
    an organic EL element formed on the insulating layer and connected to the exposed one electrode through the via hole, and having a lower electrode, an organic film layer, and an upper electrode; and
    a taper reducing layer formed on the lower electrode and contacting an upper surface of the lower electrode, an edge of the lower electrode, and the insulating layer adjacent to the lower electrode,
    wherein a taper angle of the taper reducing layer in the via hole has a first taper angle smaller than that of the via hole, and a taper angle of the taper reducing layer at the edge of the lower electrode has a second taper angle smaller than that of the edge of the lower electrode, and
    wherein the first taper angle and the second taper angle of the taper reducing layer are each greater than 0°.

2. The flat panel display of claim 1, wherein the organic film layer includes at least one selected from a group consisting of a hole injecting layer, a hole transporting layer, an emission layer, a hole blocking layer, an electron transporting layer, and an electron injecting layer, and
    the emission layer is any one selected from a group consisting of an organic film layer formed by a laser-induced thermal imaging, an organic film layer formed by an inkjet method, and an organic film layer formed by a deposition method.

3. The flat panel display of claim 1, wherein the taper reducing layer includes at least one selected from a group consisting of a small-molecule organic layer selected from carbazole-based, arylamine-based, hydrazone-based, stilbene-based, oxadiazole-based and starburst-based derivatives, and a polymer organic layer selected from PEDOT, PANI, carbazole-based, arylamine-based, perylene-based, pyrrole-based and oxadiazole-based derivatives.

4. The flat panel display of claim 1, wherein the first taper angle of the taper reducing layer is 60° or less, and the second taper angle of the taper reducing layer is 40° or less.

5. The flat panel display of claim 4, wherein the insulating layer includes at least one selected from a group consisting of a passivation layer and a planarization layer, and
    a deposition thickness of the taper reducing layer is determined by the first taper angle and the second taper angle of the taper reducing layer, a thickness of the passivation layer and/or the planarization layer, a taper angle of the via hole, and a taper angle of an edge of an anode electrode.

6. The flat panel display of claim 1, wherein the lower electrode is a reflective electrode, the upper electrode is a transparent electrode, and light emitted from the emission layer is directed toward the opposite direction of the insulating substrate, and
    the taper reducing layer has a hole transporting capability, a highest occupied molecular orbital of at least 4.5 eV, and a charge mobility of at least $10^{-8}$ cm$^2$/Vs if the lower electrode is an anode electrode, and has an electron transporting capability, a lowest unoccupied molecular orbital of at least 3.5 eV, and a charge mobility of at least $10^{-8}$ cm$^2$/Vs if the lower electrode is a cathode electrode.

* * * * *